(12) United States Patent
Itonaga

(10) Patent No.: US 11,895,866 B2
(45) Date of Patent: Feb. 6, 2024

(54) LIGHT EMITTING ELEMENT, PROJECTION TYPE DISPLAY DEVICE, AND PLANAR LIGHT EMITTING DEVICE

(71) Applicant: SONY GROUP CORPORATION, Tokyo (JP)

(72) Inventor: Kazuichiro Itonaga, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 217 days.

(21) Appl. No.: 17/295,108

(22) PCT Filed: Nov. 8, 2019

(86) PCT No.: PCT/JP2019/043911
§ 371 (c)(1),
(2) Date: May 19, 2021

(87) PCT Pub. No.: WO2020/110665
PCT Pub. Date: Jun. 4, 2020

(65) Prior Publication Data
US 2022/0006057 A1    Jan. 6, 2022

(30) Foreign Application Priority Data

Nov. 27, 2018 (JP) ................................. 2018-220849
Aug. 6, 2019 (JP) ................................. 2019-144354

(51) Int. Cl.
*H10K 50/856* (2023.01)
*H10K 50/858* (2023.01)
(Continued)

(52) U.S. Cl.
CPC ......... *H10K 50/856* (2023.02); *H10K 50/125* (2023.02); *H10K 50/858* (2023.02); *H10K 2102/00* (2023.02)

(58) Field of Classification Search
None
See application file for complete search history.

(56) References Cited

U.S. PATENT DOCUMENTS 6,328,447 B1    12/2001 Yamazaki
2005/0274960 A1    12/2005 Yokoyama et al.
(Continued)

FOREIGN PATENT DOCUMENTS

CN    1576905 A    2/2005
CN    102298250 A    12/2011
(Continued)

OTHER PUBLICATIONS

Extended European Search Report of EP Application No. 19888616.0, dated Jan. 21, 2022, 12 pages.
(Continued)

*Primary Examiner* — Daniel Whalen
(74) *Attorney, Agent, or Firm* — CHIP LAW GROUP

(57) ABSTRACT

A light emitting element includes a first electrode, an organic layer formed on the first electrode and including a luminescent layer composed of an organic luminescent material and a second electrode formed on the organic layer, and further includes a light reflecting layer provided below the first electrode. Light emitted in the luminescent layer is resonated between the light reflecting layer and an interface of the second electrode and the organic layer, and a portion of the light is output from the second electrode.

19 Claims, 19 Drawing Sheets

(51) Int. Cl.
    *H10K 50/125*     (2023.01)
    *H10K 102/00*     (2023.01)

(56) References Cited

U.S. PATENT DOCUMENTS

| | | | |
|---|---|---|---|
| 2011/0141441 A1 | 6/2011 | Konno | |
| 2016/0013415 A1* | 1/2016 | Ren | H10K 71/621 |
| | | | 257/40 |
| 2016/0087018 A1* | 3/2016 | Shim | H10K 50/865 |
| | | | 257/40 |
| 2017/0069865 A1* | 3/2017 | Park | H10K 50/81 |
| 2018/0261790 A1* | 9/2018 | Ichikawa | H10K 50/81 |
| 2019/0148470 A1 | 5/2019 | Takagi | |
| 2019/0198819 A1* | 6/2019 | Shin | H10K 59/38 |
| 2020/0321416 A1 | 10/2020 | Takagi | |

FOREIGN PATENT DOCUMENTS

| | | |
|---|---|---|
| EP | 1608029 A2 | 12/2005 |
| JP | 2002-184567 A | 6/2002 |
| JP | 2004-062113 A | 2/2004 |
| JP | 2004-133111 A | 4/2004 |
| JP | 2006-032315 A | 2/2006 |
| JP | 2007-103493 A | 4/2007 |
| JP | 2007-265638 A | 10/2007 |
| JP | 2009-049135 A | 3/2009 |
| JP | 2011-076799 A | 4/2011 |
| JP | 2012-230151 A | 11/2012 |
| JP | 2018-081831 A | 5/2018 |
| JP | 6844620 B2 | 3/2021 |
| KR | 10-2006-0046218 A | 5/2006 |
| KR | 10-2019-0015207 A | 2/2019 |
| TW | 200517009 A | 5/2005 |
| TW | I278254 B | 4/2007 |
| WO | 2001/039554 A1 | 5/2001 |
| WO | 2017/212797 A1 | 12/2017 |

OTHER PUBLICATIONS

International Search Report and Written Opinion of PCT Application No. PCT/JP2019/043911, dated Feb. 4, 2020, 12 pages of ISRWO.

* cited by examiner

LIGHT EMITTING ELEMENT, PROJECTION TYPE DISPLAY DEVICE, AND PLANAR LIGHT EMITTING DEVICE

CROSS REFERENCE TO RELATED APPLICATIONS

This application is a U.S. National Phase of International Patent Application No. PCT/JP2019/043911 filed on Nov. 8, 2019, which claims priority benefit of Japanese Patent Application No. JP 2018-220849 filed in the Japan Patent Office on Nov. 27, 2018 and also claims priority benefit of Japanese Patent Application No. JP 2019-144354 filed in the Japan Patent Office on Aug. 6, 2019. Each of the above-referenced applications is hereby incorporated herein by reference in its entirety.

TECHNICAL FIELD

The present disclosure relates to a light emitting element and a projection type display device and a planar light emitting device provided with such a light emitting element, and more specifically, a self-luminous type light emitting element and a projection type display device and a planar light emitting device provided with such a self-luminous type light emitting element.

BACKGROUND ART

In recent years, lighting devices and organic electroluminescence display devices (hereinafter, simply abbreviated as organic EL display devices) that use an organic electroluminescence element (hereinafter, simply abbreviated as an organic EL element) as a light emitting element are becoming widespread. Further, there is a strong demand for the development of methods for efficiently extracting light from organic EL display devices. This is because where the light extraction efficiency is low, the actual amount of light emitted from an organic EL element is not effectively utilized, which causes a large loss in terms of power consumption and the like. Attempts have been made to control the light generated in the luminescent layer, such as improving the color purity of the emitted color and increasing the luminous efficiency by introducing a resonator structure in an organic EL element (see, for example, WO 2001/039554). Further, for example, JP 2009-049135A discloses that the emission intensity can be maximized by ensuring the relationship such that the light generated in a resonator structure and the light reflected at each reflection end and returned intensify each other.

In addition, a conventional projection type display device includes, for example, a light source that outputs light, a spatial modulator that modulates the light from this light source to form an image, and a projection optical system that projects an image from the spatial modulator onto, for example, a screen.

CITATION LIST

Patent Literature

[PTL 1]
WO 2001/039554
[PTL 2]
JP 2009-049135 A

SUMMARY

Technical Problem

However, as far as the investigation conducted by the present inventors has shown, a projection type display device in which a light source that outputs light and a space modulator that forms an image are integrated, that is, a projection type display device and a planar light emitting device that can form an image by a self-luminous type light emitting element instead of the light source and the space modulator are not known.

Therefore, an object of the present disclosure is to provide a projection type display device capable of forming an image by self-luminous type light emitting elements, a planar light emitting device configured of self-luminous type light emitting elements, and a light emitting element suitable for use in such projection type display device or planar light emitting device.

Solution to Problem

A light emitting element according to the first aspect of the present disclosure for achieving the above object
 a first electrode;
 an organic layer formed on the first electrode and including a luminescent layer composed of an organic luminescent material; and
 a second electrode formed on the organic layer, wherein
 the luminescent layer is configured by layering a plurality of luminescent layers that emit light of the same color.

A light emitting element according to the second aspect of the present disclosure for achieving the above object comprises:
 a first electrode;
 an organic layer formed on the first electrode and including a luminescent layer composed of an organic luminescent material; and
 a second electrode formed on the organic layer, and further comprises
 a light reflecting layer provided below the first electrode, wherein
 light emitted in the luminescent layer is resonated between the light reflecting layer and an interface of the second electrode and the organic layer, and a portion of the light is output from the second electrode. That is, a resonator structure is formed between the light reflecting layer and the interface of the second electrode and the organic layer.

A projection type display device according to the first aspect of the present disclosure for achieving the above object is configured of
 a panel comprising:
 a first substrate;
 a second substrate; and
 a plurality of light emitting elements sandwiched between the first substrate and the second substrate, wherein
 each light emitting element includes
 a first electrode;
 an organic layer formed on the first electrode and including a luminescent layer composed of an organic luminescent material; and
 a second electrode formed on the organic layer,
 the luminescent layer being configured by layering a plurality of luminescent layers that emit light of the same color.

A projection type display device according to the second aspect of the present disclosure for achieving the above object is configured of a panel comprising:
a first substrate;
a second substrate; and
a plurality of light emitting elements sandwiched between the first substrate and the second substrate, wherein
each light emitting element includes
a first electrode;
an organic layer formed on the first electrode and including a luminescent layer composed of an organic luminescent material; and
a second electrode formed on the organic layer, and
each light emitting element further includes a light reflecting layer provided below the first electrode, and
light emitted in the luminescent layer is resonated between the light reflecting layer and an interface of the second electrode and the organic layer, and a portion of the light is output from the second electrode. That is, a resonator structure is formed between the light reflecting layer and the interface of the second electrode and the organic layer.

The projection type display device according to the third aspect of the present disclosure for achieving the above object is configured of a panel comprising:
a first substrate;
a second substrate; and
a plurality of light emitting elements sandwiched between the first substrate and the second substrate, wherein
each light emitting element is configured of the light emitting element according to the first or second aspect of the present disclosure described above.

A planar light emitting device of the present disclosure for achieving the above object is configured of a panel comprising:
a first substrate;
a second substrate; and
a plurality of light emitting elements sandwiched between the first substrate and the second substrate, wherein
each light emitting element is configured of the light emitting element according to the first or second aspect of the present disclosure described above.

BRIEF DESCRIPTION OF DRAWINGS

FIG. 18B is a graph showing the relationship between the light outputting angle from the center line passing through the center of a light emitting unit of the light emitting element and light intensity.

FIG. 19B is a schematic arrangement diagram of light emitting regions.

DESCRIPTION OF EMBODIMENTS

Figure 1:
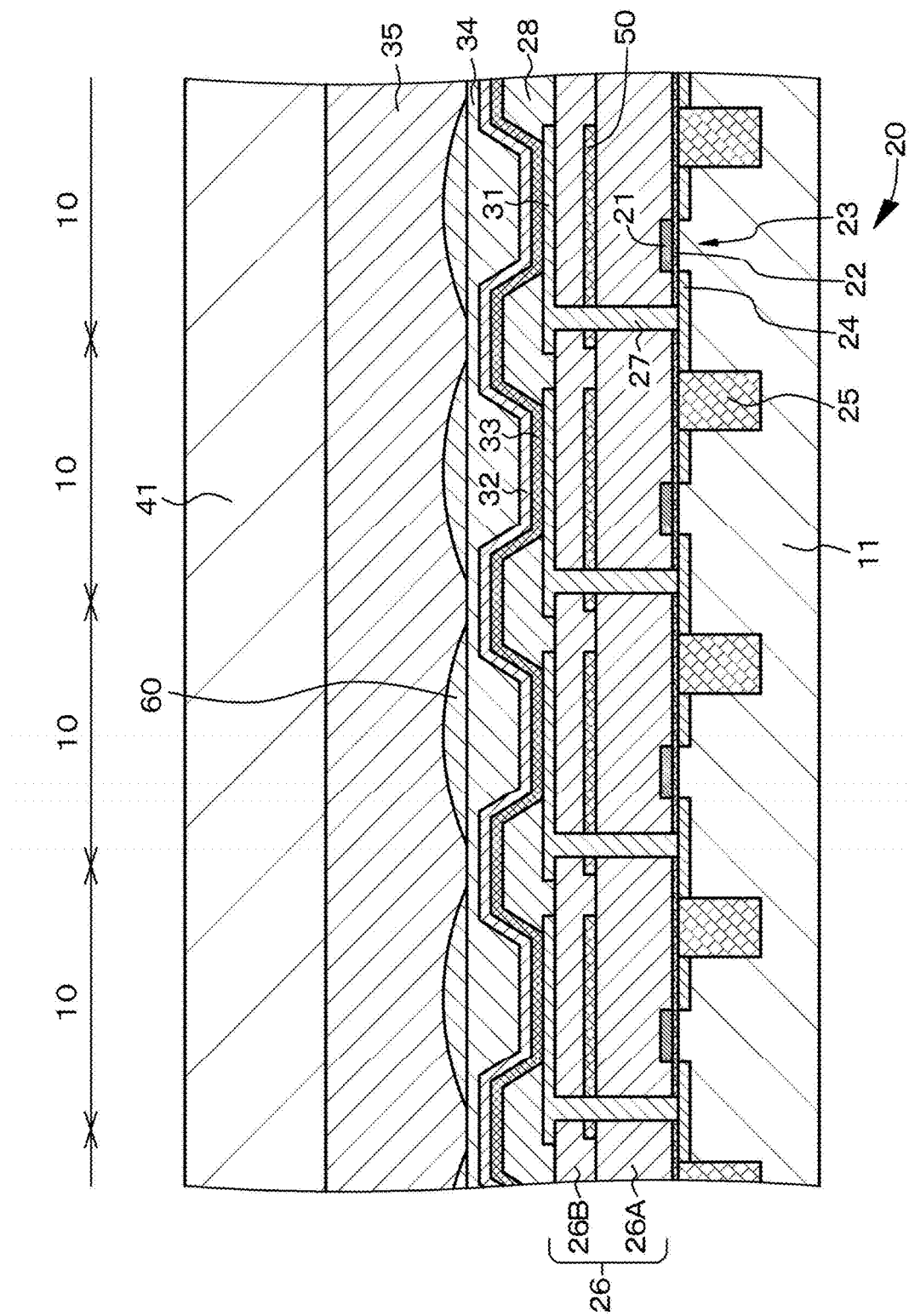
FIG. 1 is a schematic partial cross-sectional view of a light emitting element of Example 1 and a panel constituting a projection type display device of Example 1.

Hereinafter, the present disclosure will be described based on examples with reference to the drawings, but the present disclosure is not limited to the examples, and various numerical values and materials in the examples are merely illustrative. The description will be given in the following order.

1. General explanation of the light emitting element according to the first and second aspects of the present disclosure, the projection type display device according to the first to third aspects of the present disclosure, and the planar light emitting device of the present disclosure 2. Example 1 (the light emitting element according to the second aspect of the present disclosure, and the projection type display device according to the second aspect of the present disclosure and the third aspect of the present disclosure)

3. Example 2 (the light emitting element according to the first aspect of the present disclosure, and the projection type display device according to the first aspect of the present disclosure and the third aspect of the present disclosure)

4. Example 3 (combination of Example 1 and Example 2)

5. Other

<General Explanation of the Light Emitting Element According to the First and Second Aspects of the Present Disclosure, the Projection Type Display Device According to the First to Third Aspects of the Present Disclosure, and the Planar Light Emitting Device of the Present Disclosure>

In a possible embodiment of the light emitting element according to the first aspect of the present disclosure, an intermediate layer (charge generation layer) is formed between the luminescent layer and the luminescent layer. Here, a material constituting the intermediate layer can be exemplified by at least one kind of material selected from the group consisting of lithium (Li), calcium (Ca), sodium (Na), cesium (Cs), molybdenum oxide ($MoO_3$), vanadium oxide ($V_2O_5$) and tungsten oxide ($WO_3$), and broadly by conductive metal materials, alloy materials, and metal compounds. It is necessary to prevent damage to the luminescent layer due to the film formation of the intermediate layer. The intermediate layer is formed on a luminescent layer composed of an organic material by, for example, a sputtering method, but if the film forming temperature of the intermediate layer exceeds, for example, 100° C., the luminescent layer may be damaged. Therefore, when the intermediate layer is formed based on the sputtering method, the material constituting the intermediate layer needs to be selected from the materials for which the film forming temperature can be 100° C. or lower. The thickness of the intermediate layer may be, but is not limited to, 2 nm to 10 nm.

Furthermore, in a possible embodiment of the light emitting element according to the first aspect of the present disclosure including the preferred embodiments described above, the plurality of luminescent layers have the same composition.

Furthermore, in a possible embodiment, the light emitting element according to the first aspect of the present disclosure including the preferred embodiments described above further includes a light reflecting layer, wherein light emitted in the luminescent layer is resonated between the light reflecting layer and an second interface of the second electrode and the organic layer, and a portion of the light is output from the second electrode. Here, in a possible embodiment, the light reflecting layer is arranged below the first electrode, or is configured to be arranged above the first electrode and below the luminescent layer. Such a preferable configuration of the light emitting element according to the first aspect of the present disclosure can be inclusive of various below-described preferable forms of the light emitting element according to the second aspect of the present disclosure. In this case, the maximum light emission position of the luminescent layer in the luminescent layer formed by layering a plurality of luminescent layers emitting the same color refers to the average position in the thickness direction of the plurality of luminescent layers. Specifically, the position corresponding to the average value of the distances between the interface between the first electrode and the organic layer (referred to as "first interface" for convenience) and the center in the thickness direction of each luminescent layer is taken as the maximum light emitting position. In the configuration in which the light reflecting layer is arranged above the first electrode and below the luminescent layer, the first electrode is not necessarily required to be transparent. Further, in some cases, an embodiment is possible in which the formation of the light reflecting layer is omitted so that the first electrode also serves as the light reflecting layer. In this case, the distance from the maximum light emission position of the luminescent layer to the first electrode is taken as $L_1$, the optical distance is taken as $OL_1$, and the phase shift amount of the reflected light (light reflected by the light reflecting layer) generated at the first electrode is taken as $\Phi_1$. The above will be described in detail hereinbelow.

In the light emitting element according to the first aspect of the present disclosure, the number of luminescent layers (N) is 2 or more, but this number is not limiting, and "4" can be exemplified as an upper limit value. The number of layers in the intermediate layer is (N-1). In general, as the number N of the luminescent layers increases, the voltage for driving the light emitting element increases. Therefore, the number N of the luminescent layers is limited by the voltage for driving the light emitting element, and also by the withstand voltage of the light emitting element drive unit.

In the light emitting element according to the second aspect of the present disclosure, a resonance structure is formed between the interface between the second electrode and the organic layer (referred to as "second interface" for convenience) and the surface of the light reflecting layer on the first electrode side (this surface is also referred to as "first interface" for convenience), but a configuration may be used such that assuming that the optical distance from the maximum light emission position of the luminescent layer to the first interface is $OL_1$, the optical distance from the maximum light emission position of the luminescent layer to the second interface is $OL_2$, and $m_1$ and $m_2$ are integers, the following formulas (1-1) and (1-2) are satisfied.

$$0.7\{-\Phi_1/(2\pi)+m_1\} \leq 2 \times OL_1/\lambda \leq 1.2\{-\Phi_1/(2\pi)+m_1\} \quad (1\text{-}1)$$

$$0.7\{-\Phi_2/(2\pi)+m_2\} \leq 2 \times OL_2/\lambda \leq 1.2\{-\Phi_2/(2\pi)+m_2\} \quad (1\text{-}2)$$

Here, $\lambda$: maximum peak wavelength of the spectrum of light generated in the luminescent layer (or the desired wavelength in the light generated in the luminescent layer);

$\Phi_1$: phase shift amount (unit: radian) of reflected light generated at the first interface (light reflected at the first interface). However, $-2\pi < \Phi_1 \leq 0$; and $\Phi_2$: phase shift amount (unit: radian) of reflected light (light reflected at the second interface) generated at the second interface. However, $-2\pi < \Phi_2 \leq 0$.

Here, the value of $m_1$ is 0 or more, and the value of $m_2$ is 0 or more, independently of the value of $m_1$, but from the viewpoint of potential design in the organic layer, that is, from the viewpoint of optimizing the potential in the organic layer, it is preferable that $m_1 \geq 1$ and $m_2 \geq 1$. As a result, as will be described in detail hereinbelow, the value of the full width at half maximum (FWHM) of the light output from the light emitting element can be made smaller.

The distance $L_1$ from the maximum light emission position of the luminescent layer to the first interface refers to the actual distance (physical distance) from the maximum light emission position of the luminescent layer to the first interface, and the distance $L_2$ from the maximum light emission position of the luminescent layer to the second interface refers to the actual distance (physical distance) from the maximum light emission position of the luminescent layer to the second interface. The optical distance is also called an optical path length, and generally refers to n×L when a light ray passes through a medium having a refractive index n by a distance L. The same applies also hereinbelow. Therefore, assuming that the average refractive index is $n_{ave}$, the following relationships are valid.

$$OL_1 = L_1 \times n_{ave}$$

$$OL_2 = L_2 \times n_{ave}$$

Here, the average refractive index $n_{ave}$ is obtained by adding up the products of the refractive index and the thickness of each layer constituting the organic layer (or the organic layer, the first electrode, and the interlayer insulating layer), and dividing the sum by the thickness of the organic layer (or the organic layer, the first electrode, and the interlayer insulating layer).

The light emitting element may be designed by determining the desired wavelength λ (specifically, the red wavelength, the green wavelength, and the blue wavelength) of the light generated in the luminescent layer, and obtaining various parameters such as $OL_1$ and $OL_2$ in the light emitting element on the basis of formulas (1-1) and (1-2).

The light reflecting layer and the second electrode absorb a part of the incident light and reflect the rest. Therefore, a phase shift occurs in the reflected light. The phase shift amounts $\Phi_1$ and $\Phi_2$ can be determined by measuring the values of the real and imaginary parts of the complex refractive index of the materials constituting the light reflecting layer and the second electrode with, for example, an ellipsometer, and performing calculations on the basis of these values (see, for example, "Principles of Optic", Max Born and Emil Wolf, 1974 (PERGAMON PRESS)). The refractive indexes of the organic layer, the interlayer insulating layer, and the like and also the refractive index of the first electrode, or the refractive index of the first electrode in the case where the first electrode absorbs a part of the incident light and reflects the rest, can be also obtained by measuring with the ellipsometer.

Examples of the material constituting the light reflecting layer include aluminum, aluminum alloys (for example, Al—Nd or Al—Cu), Al/Ti layered structure, Al—Cu/Ti layered structure, chromium (Cr), silver (Ag), and silver alloys (for example, Ag—Cu, Ag—Pd—Cu, and Ag—Sm—Cu). The light reflecting layer can be formed by, for example, vapor deposition methods including an electron beam vapor deposition method, a hot filament vapor deposition method, and a vacuum vapor deposition method, a sputtering method, a CVD method or an ion plating method; a plating method (electroplating method or electroless plating method); a lift-off method; a laser ablation method; a sol-gel method; or the like. Depending on the material constituting the light-reflecting layer, it is preferable to form a base film composed of, for example, TiN in order to control the crystal state of the light reflecting layer to be formed.

The light emitting element according to the first aspect and the second aspect of the present disclosure can be configured such that the value of the full width at half maximum (FWHM) of the light output from the light emitting element is 30 nm or less. The value of the full width at half maximum (FWHM) of the light output from the conventional organic EL element described hereinbelow is often 60 nm to 100 nm, and the light emitting element according to the first aspect and the second aspect of the present disclosure has a sharper emission spectrum than the conventional organic EL elements.

Further, in a possible embodiment of the light emitting element according to the first aspect and the second aspect of the present disclosure, where the light intensity (light intensity of the light output from the light emitting unit) at the center line passing through the center of the light emitting unit of the light emitting element is taken as 100%, the directional half-value angle, which is the angle formed by the center line and the direction with respect to the center line that has a 50% light intensity (light intensity of the light output from the light emitting unit), is 25 degrees or less. The directional half-value angle of Lambersian radiation is about 70 degrees. That is, the light output from the light emitting element according to the first aspect and the second aspect of the present disclosure has higher directivity than the conventional organic EL element described later, or is close to parallel light. Therefore, a telecentric optical system that is often required between the light source of the conventional projection type display device (projector) and a spatial modulator is unnecessary, and the projection type display device can be simplified. Further, the light output from the light emitting element according to the first aspect and the second aspect of the present disclosure is highly directional light or light close to parallel light. Therefore, it is possible to prevent the occurrence of a phenomenon that the light generated in the luminescent layer repeatedly undergoes total reflection between the first substrate and the second substrate to be output from the joint portion (end face of the panel) of the first substrate and the second substrate, and a loss occurs in the light output from the panel.

Further, in a possible embodiment of the light emitting element according to the second aspect of the present disclosure including the preferred configurations described above, a lens member (on-chip lens) is arranged on the light outputting side of the organic layer. By adopting such an embodiment, the light output from the light emitting element can be in a desired state such as parallel light. The lens member (on-chip microlens) can be configured of, for example, a transparent resin material such as an acrylic resin, and can be obtained by melt-flowing or by etching back the transparent resin material, and can also be obtained by a method such as forming a transparent resin material into a lens shape on the basis of a nanoprint method. In a possible embodiment, the lens member (on-chip lens) has, for example, a positive optical power, and in a possible, but not limiting, embodiment, has a plano-convex lens shape. An embodiment is also possible in which a convex surface is located on the second substrate side or on the first substrate side, and the convex surface can be spherical or aspherical, and the planar shape can be a shape suitable for the planar shape of the light emitting region, which will be described hereinbelow, such as circular, elliptical, or rectangular with rounded corners. In a possible embodiment, a second lens member that controls the traveling direction of the light output from the lens member is further included.

In a possible embodiment, a light absorption layer (black matrix layer) is formed between the lens members of the adjacent light emitting elements. By forming a light absorption layer (black matrix layer) between the lens members of the adjacent light emitting elements, it is possible to reliably suppress the occurrence of duplication of minute images between the adjacent light emitting elements. That is, a phenomenon in which a unit image formed by a certain light emitting element and a unit image formed by a light emitting element adjacent to or located near the certain light emitting element partially overlap (hereinafter, referred to as "partial duplication of unit pixels" for convenience), can be reliably suppressed. The light absorption layer is composed of, for example, a black resin film (specifically, for example, a black polyimide resin) having an optical density of 1 or more that is mixed with a black colorant, or the light absorption layer is configured of a thin-film filter that uses the interference of thin films. The thin-film filter is formed by layering two or more thin films made of, for example, a metal, a metal nitride or a metal oxide, and attenuates light by utilizing the interference of the thin films. Specific examples of the thin-film filter include those in which Cr and chromium (III) oxide ($Cr_2O_3$) are alternately layered.

Further, in a possible embodiment of the light emitting device according to the second aspect of the present disclosure including the preferable configurations and embodiments described above, a metal thin-film filter layer is further formed between the first electrode and the light reflecting layer. The metal thin-film filter layer is composed of, for example, gold (Au), silver (Ag), platinum (Pt), aluminum (Al), copper (Cu), tungsten (W), or alloys including these materials. In the metal thin-film filter layer, for example, a large number of holes having a planar shape of a circle, an ellipse, a rectangle, a letter "U", a cross, and the like and a size of about 200 nm are formed and arrayed two-dimensionally (for example arranged on grid points or arranged in a staggered pattern), or a large number of slits are formed. The metal thin-film filter layer is disclosed in, for example, JP 2015-232599 A. In the metal thin-film filter layer, only light having a specific wavelength is transmitted by means of surface plasmon polariton (SPR) in which free electrons on the metal surface are coupled with electromagnetic waves. A metal thin-film filter layer subjected to such periodic microfabrication is also called a plasmonic filter (hole array filter). Although the metal thin-film filter layer is widely known in the field of image capturing devices, the use thereof in a projection type display device provided with a self-luminous type light emitting elements is not known as far as the present inventors have investigated. Depending on the wavelength of the light output by the light emitting element (for example, when the light emitting element outputs infrared rays), it is also possible, to form the metal thin-film filter layer described above instead of the light reflecting layer, and reflect the light by the metal thin-film filter layer.

Further, in a possible embodiment of the light emitting element according to the first and second aspects of the present disclosure including the preferable configurations and embodiments described above, when the light intensity (light intensity of the light output from the light emitting element) at the center line passing through the center of the light emitting unit of the light emitting element is denoted by $I_0$ and the light intensity (light intensity of the light output from the light emitting element) at the center line passing through the center of the light emitting unit of the light emitting element without the light reflecting layer is denoted by $I_{conv}$, $I_0/I_{conv} \geq 5$ is satisfied.

Further, in a possible embodiment of the light emitting element according to the second aspect of the present disclosure including the preferable configurations and embodiments described above, the first electrode and the light reflecting layer are surrounded by a light shielding portion or a light reflecting portion (reflector portion). That is, a light shielding portion may be provided between the light emitting element and the light emitting element, or a light reflecting portion may be provided. By adopting such an embodiment, it is possible to reliably prevent the occurrence of partial duplication of unit pixels. Specific examples of the light shielding material constituting the light shielding portion include materials capable of shielding light, such as titanium (Ti), chromium (Cr), tungsten (W), tantalum (Ta), aluminum (Al), and $MoSi_2$. The light shielding portion can be formed by a vapor deposition method including an electron beam vapor deposition method, a hot filament vapor deposition method, and a vacuum vapor deposition method, a sputtering method, a CVD method, an ion plating method, or the like. Examples of the material constituting the light reflecting portion (reflector portion) include an aluminum (Al) layer, an aluminum alloy layer (for example, Al—Nd layer), a chromium (Cr) layer, a silver (Ag) layer, and a silver alloy layer (for example, Ag—Cu layer, Ag—Pd—Cu layer, Ag—Sm—Cu layer), and this portion can be formed by, for example, a vapor deposition method including an electron beam vapor deposition method, a thermal filament vapor deposition method, and a vacuum vapor deposition method, a sputtering method, a CVD method or an ion plating method; a plating method (electroplating method or electroless plating method); a lift-off method; a laser ablation method; a sol-gel method or the like.

Further, in a possible embodiment of the light emitting device according to the second aspect of the present disclosure including the preferable configurations and embodiments described above, the first electrode is composed of a light transmitting material and the second electrode is composed of a semi-light transmitting material. Here, in a possible embodiment, the first electrode is composed of ITO or IZO, and the second electrode is composed of at least one kind of material selected from the group consisting of Ag, Ag—Mg, Ag—Nd—Cu, Au, Ag—Cu, Al, and Al—Cu. The average light transmittance of the second electrode is desirably 50% to 90%, and preferably 60% to 90%.

In the projection type display device according to the first to third aspects of the present disclosure, or the planar light emitting device of the present disclosure, the panel outputs monochromatic light (for example, red light (has an emission spectrum peak within the range of red light with a wavelength of 620 nm to 750 nm), green light (has an emission spectrum peak within the range of green light with a wavelength of 495 nm to 570 nm), and blue light (has an emission spectrum peak within the range of green light with a wavelength of 450 nm to 495 nm)).

In a possible embodiment, the projection type display device according to the first to third aspects of the present disclosure is configured of three panels of
one red light outputting panel that outputs red light,
one green light outputting panel that outputs green light, and
one blue light outputting panel that outputs blue light. In another possible embodiment, in this case, the projection type display device further has one blue light outputting panel for outputting blue light or one green light outputting panel for outputting green light, and thus is configured of four panels. In this case, the four panels may be arranged in an array (1×4 state), or the four panels may be arranged in a 2×2 state.

The projection type display device according to the first to third aspects of the present disclosure including the above preferable embodiments and configurations can be embodied to further include a projection lens system on the light outputting side. Alternatively,
an embodiment is possible in which there are provided an image synthesizing means (for example, an unpolarized dichroic prism or a Philips prism) for synthesizing images output from a plurality of panels into one image, and
a projection lens system on the light outputting side of the image synthesizing means (for example, an unpolarized dichroic prism or a Philips prism), and in this case, three panels or four panels constituting the projection type display device may be arranged at the optimum positions in the image synthesizing means.

A lens having a high F number and a high depth of field (DOF) is preferably used as a lens constituting the projection lens system. Further, the light incident on the projection lens system or the image synthesizing means is preferably parallel light with respect to the optical axis of the lens in the paraxial region of the lens. When using a lens with a high F number, it is necessary to reduce the divergence angle (direction half-value angle) of the light output from the light emitting element. For that purpose, an on-chip microlens may be provided on the light outputting side of the light emitting element or the resonator structure may be optimized.

Furthermore, in the projection type display device according to the first to third aspects of the present disclosure including the preferred embodiments and configurations described above, the panel can be embodied not only to be flat, but can also be embodied to be curved.

When the projection type display device according to the first to third aspects of the present disclosure including the preferred configurations and embodiments described above does not include means for synthesizing images output from a plurality of panels into one image, various corrections such as keystone correction, distortion correction and magnification correction of the image to be formed on the screen may be performed using software simultaneously with properly aligning a plurality of panels, for example, in order to properly display (synthesize) images from a plurality of panels on a screen. For example, in order to properly display (synthesize) images from a plurality of panels on a screen, pixels of the images from the plurality of panels may be partially overlapped, rather than completely overlapped. There is no problem even if the pixels are displaced as long as the displacement is below the resolution limit of the observer's eyes.

In a possible embodiment of the light emitting elements according to the first and second aspects of the present disclosure including the preferred configurations and embodiments described above, and the light emitting elements according to the first and second aspects of the present disclosure including the preferred configurations and embodiments described above that constitute the projection type display device or the planar light emitting device according to the first to third aspects of the present disclosure including the preferred configurations and embodiments described above (hereinafter, these light emitting elements are collectively referred to as "light emitting elements of the present disclosure"), the light emitting unit constituting the light emitting element includes an organic electroluminescence layer. That is, the planar light emitting device or the panel constituting the projection type display device according to the first to third aspects of the present disclosure including various preferable embodiments and configurations described above can be embodied to be composed of an organic electroluminescence panel (organic EL panel), the light emitting element can be embodied to be composed of an organic electroluminescence element (organic EL element), and the organic layer can be embodied to be composed of an organic electroluminescence layer. Further, the organic EL panel can be configured as a top emission type (upper-surface emission type) organic EL panel (upper-surface emission type organic EL panel) that outputs light from the second substrate where the light from the organic layer is output through the second substrate.

Hereinafter, an embodiment in which the light emitting unit constituting the light emitting element includes an organic electroluminescence layer and an embodiment in which the panel is composed of a top emission type organic EL panel will be described.

The light emitting unit in the light emitting element is configured of a first electrode, an organic layer, and a second electrode. The first electrode can be configured to be in contact with a part of the organic layer, or the organic layer can be configured to be in contact with a part of the first electrode. Specifically, a configuration may be such that the size of the first electrode is smaller than that of the organic layer, or a configuration may be such that the size of the first electrode is the same as that of the organic layer, but an insulating layer is formed in a part between the first electrode and the organic layer, or a configuration may be such that the size of the first electrode is larger than that of the organic layer. The region where the first electrode and the organic layer are in contact is a light emitting region. The area center of gravity of the light emitting region corresponds to the center of the light emitting unit described above.

The first electrode is provided for each light emitting element. The organic layer is provided for each light emitting element, or is provided to be shared by the light emitting elements. The second electrode may be a common electrode for a plurality of light emitting elements. That is, the second electrode may be a so-called solid electrode. The first substrate is arranged below or under the substrate, and the second substrate is arranged above the second electrode. The light emitting region is provided on the substrate. The light emitting elements are formed on the first substrate side.

The material constituting the substrate can be exemplified by insulating materials such as $SiO_2$, SiN, and SiON. The substrate is formed by a forming method suitable for the material constituting the substrate, specifically, can be formed by a well-known method, for example, various CVD methods, various coating methods, various PVD methods including a sputtering method and a vacuum vapor deposition method, various printing methods such as a screen printing method, a plating method, an electrodeposition method, a dipping method, and a sol-gel method.

A light emitting element drive unit is provided under or below the substrate, but such a configuration is not limiting. The light emitting element drive unit is configured of, for example, a transistor (specifically, for example, MOSFET) formed on a silicon semiconductor substrate constituting the first substrate, or a thin-film transistor (TFT) provided on various substrates constituting the first substrate. In a possible embodiment, the transistor or TFT constituting the light emitting element drive unit and the first electrode can be configured to be connected to each other via a contact hole (contact plug) formed in the substrate or the like. The light emitting element drive unit may have a well-known circuit configuration. The second electrode is connected to the light emitting element drive unit via a contact hole (contact plug) formed in the substrate or the like on the outer peripheral portion of the organic EL panel.

The first substrate or the second substrate can be configured of a silicon semiconductor substrate, a high-distortion point glass substrate, a soda glass ($Na_2O.CaO.SiO_2$) substrate, a borosilicate glass ($Na_2O.B_2O_3.SiO_2$) substrate, a forsterite ($2MgO.SiO_2$) substrate, a lead glass ($Na_2O.PbO.SiO_2$) substrate, various glass substrates with an insulating material layer formed on the surface, a quartz substrate, a quartz substrate with an insulating material layer formed on the surface, and organic polymers (having the form of a polymer material such as a flexible plastic film, a plastic sheet, or a plastic substrate configured of a polymer material) exemplified by polymethyl methacrylate (poly (methyl methacrylate), PMMA), polyvinyl alcohol (PVA), polyvinylphenol (PVP), polyether sulfones (PES), polyimides, polycarbonates, and polyethylene terephthalate (PET). The materials constituting the first substrate and the second substrate may be the same or different. However, the substrate that transmits the light from the light emitting element is required to be transparent to the light from the light emitting element.

In the light emitting device according to the first aspect of the present disclosure, basically, as described above, transparency is not necessarily required for the first electrode. In this case, when the first electrode functions as an anode electrode, examples of the material constituting the first electrode include metals or alloys with high work function such as platinum (Pt), gold (Au), silver (Ag), chromium (Cr), tungsten (W), nickel (Ni), copper (Cu), iron (Fe), cobalt (Co), and tantalum (Ta) (for example, a Ag—Pd—Cu alloy including silver as the main component, 0.3% by mass to 1% by mass of palladium (Pd) and 0.3% by mass to 1% by mass of copper (Cu), an Al—Nd alloy, an Al—Cu alloy, and an Al—Cu—Ni alloy). Furthermore, when a conductive material having a small work function value, such as aluminum (Al) and an alloy including aluminum, and having high light reflectance is used, the material can be made suitable for an anode electrode by improving the hole injection characteristic by providing an appropriate hole injection layer or the like. The thickness of the first electrode can be exemplified by 0.1 μm to 1 μm. Alternatively, a structure can be obtained in which a transparent conductive material having excellent hole injection characteristic, such as indium and tin oxide (ITO) or indium and zinc oxide (IZO), is layered on a reflective material film having high light reflectivity, such as a dielectric multilayer film or aluminum (Al) or an alloy thereof (for example, Al—Cu—Ni alloy).

In the light emitting element according to the first aspect of the present disclosure, or in some cases, in the light emitting element according to the second aspect of the present disclosure, transparency is required for the first electrode. In this case, in addition to the aforementioned indium-tin oxide (including ITO, Indium Tin Oxide, Sn-doped $In_2O_3$, crystalline ITO and amorphous ITO) and indium-zinc oxide (IZO, Indium Zinc Oxide), examples of the material constituting the first electrode include various transparent conductive materials such as transparent conductive materials having indium oxide, indium-gallium oxide (IGO), indium-doped gallium-zinc oxide (IGZO, In—GaZnO$_4$), IFO (F-doped $In_2O_3$), ITiO (Ti-doped $In_2O_3$), InSn, InSnZnO, tin oxide ($SnO_2$), ATO (Sb-doped $SnO_2$), FTO (F-doped $SnO_2$), zinc oxide (ZnO), aluminum oxide-doped zinc oxide (AZO), gallium-doped zinc oxide (GZO), B-doped ZnO, AlMgZnO (aluminum oxide- and magnesium oxide-doped zinc oxide), antimony oxide, titanium oxide, NiO, spinel-type oxides, oxides having an $YbFe_2O_4$ structure, gallium oxide, titanium oxide, niobium oxide, nickel oxide, or the like as a base layer.

When the first electrode is to be caused to function as a cathode electrode, it is desirable that the first electrode be configured of a conductive material having a small work function value and a high light reflectance, but a conductive material having a high light reflectance and suitable as an anode electrode can also be made suitable for the cathode electrode by improving the electron injection characteristic thereof by providing an appropriate electron injection layer.

When the second electrode is to be caused to function as a cathode electrode, it is desirable that the second electrode be configured of a conductive material with a small work function value so that the material (semi-light transmitting material or light transmitting material) constituting the second electrode could transmit emitted light and could efficiently inject electrons into the organic layer (luminescent layer), and in a possible embodiment, as described above, the second electrode can be configured of at least one kind of material selected from the group consisting of Ag, Ag—Mg, Ag—Nd—Cu, Ag—Cu, Au, Al and Al—Cu. Alternatively, for example, metals and alloys having a small work function, such as aluminum (Al), silver (Ag), magnesium (Mg), calcium (Ca), sodium (Na), strontium (Sr), alloys of an alkali metal or an alkaline earth metal and silver (Ag) (for example, an alloy of magnesium (Mg) and silver (Ag) (Mg—Ag alloy)), a magnesium-calcium alloy (Mg—Ca alloy), an alloy of aluminum (Al) and lithium (Li) (Al—Li alloy), and the like, and among them, a Mg—Ag alloy is preferable, and such alloy can be exemplified by a volume ratio of magnesium and silver of Mg:Ag=5:1 to 30:1. Alternatively, an alloy of magnesium and calcium with a volume ratio of Mg:Ca=2:1 to 10:1 can be exemplified.

The thickness of the second electrode can be exemplified by 4 nm to 50 nm, preferably 4 nm to 20 nm, and more preferably 6 nm to 12 nm. Alternatively, the second electrode can be configured to have a layered structure of the above-mentioned material layer and a so-called transparent electrode composed of, for example, ITO or IZO (for example, a thickness of $3 \times 10^{-8}$ m to $1 \times 10^{-6}$ m) from the organic layer side.

A bus electrode (auxiliary electrode) composed of a low resistance material such as aluminum, aluminum alloy, silver, silver alloy, copper, copper alloy, gold, or gold alloy may be provided for the second electrode to reduce the resistance of the second electrode as a whole. It is desirable that the average light transmittance of the second electrode be 50% to 90%, preferably 60% to 90%. Meanwhile, when the second electrode is to be caused to function as an anode electrode, it is desirable that the second electrode be configured of a conductive material that transmits emitted light and has a large work function value.

Examples of the method for forming the first electrode and the second electrode include a vapor deposition method including an electron beam vapor deposition method, a hot filament vapor deposition method, and a vacuum vapor deposition method, a sputtering method, a chemical vapor deposition method (CVD method), a MOCVD method, a combination of a plating method and an etching method; various printing methods such as a screen printing method, an inkjet printing method, a metal mask printing method; plating methods (electroplating method and electroless plating method); a lift-off method; a laser ablation method; a sol-gel method, and the like. With various printing methods and plating methods, it is possible to directly form the first electrode and the second electrode having a desired shape (pattern). Since the second electrode is formed after the organic layer is formed, from the viewpoint of preventing the occurrence of damage to the organic layer, it is preferable that the second electrode be formed on the basis of, in particular, a film forming method with a small energy of film forming particles, such as a vacuum vapor deposition method, or a film forming method such as MOCVD. Where the organic layer is damaged, non-emission pixels (or non-emission sub-pixels) called "dead points" may be generated due to the generation of leak current.

The organic layer includes a luminescent layer composed of an organic luminescent material, and specifically can be configured of, for example, a layered structure of a hole transport layer, a luminescent layer and an electron transport layer, a layered structure of a hole transport layer and a luminescent layer also serving as an electron transport layer, a layered structure of a hole injection layer, a hole transport layer, a luminescent layer, an electron transport layer, an electron injection layer, and the like. A method for forming the organic layer can be exemplified by a physical vapor deposition method (PVD method) such as a vacuum vapor deposition method; a printing method such as a screen printing method and an inkjet printing method; a laser transfer method in which a layered structure of an organic layer and a laser absorption layer formed on a transfer substrate is irradiated with laser radiation to separate the organic layer on the laser absorption layer and transfer the organic layer, and various coating methods. Where the organic layer is formed based on the vacuum vapor deposition method, for example, a so-called metal mask can be used to deposit a material that has passed through an opening provided in the metal mask thereby obtaining an organic layer.

It is preferable that a protective layer (planarizing layer) be formed so as to cover the second electrode or between the second electrode and the second substrate. The material constituting the protective layer can be exemplified by an acrylic resin and can also be exemplified by SiN, SiON, SiC, amorphous silicon ($\alpha$-Si), $Al_2O_3$, and $TiO_2$. The protective layer can be formed based on known methods such as various CVD methods, various coating methods, various PVD methods including a sputtering method and a vacuum vapor deposition method, and various printing methods such as a screen printing method. Further, an ALD (Atomic Layer Deposition) method can also be adopted as a method for forming the protective layer. The protective layer may be shared by a plurality of light emitting elements, or may be individually provided in each light emitting element. The protective layer and the second substrate, or when a structure (for example, a lens member) is provided on the inner surface of the second substrate facing the first substrate, the protective layer and the second substrate including the protective layer are joined through, for example, a resin layer (sealing resin layer). A material constituting the resin layer (sealing resin layer) can be exemplified by heat-curable adhesives such as acrylic adhesives, epoxy adhesives, urethane adhesives, silicone adhesives, and cyanoacrylate adhesives, and ultraviolet curable adhesives.

An ultraviolet absorbing layer, a contamination prevention layer, a hard coat layer, and an antistatic layer may be formed, and a protective member (for example, a cover glass) may be arranged on the outermost surface (specifically, the outer surface of the second substrate) that outputs light of the organic EL panel.

In an organic EL panel, a substrate, an insulating layer, and an interlayer insulating layer are formed, and insulating materials constituting the substrate, insulating layer, and interlayer insulating layer can be exemplified by a $SiO_x$-based material (material constituting a silicon oxide film) such as $SiO_2$, NSG (non-doped silicate glass), BPSG (boron phosphorus silicate glass), PSG, BSG, AsSG, SbSG, PbSG, SOG (spin-on glass), LTO (Low Temperature Oxide, low temperature CVD-$SiO_2$), low-melting-point glass, and glass paste; a SiN-based material including SiON-based material; SiOC; SiOF; and SiCN. Alternative examples include inorganic insulating materials such as titanium oxide ($TiO_2$), tantalum oxide ($Ta_2O_5$), aluminum oxide ($Al_2O_3$), magnesium oxide (MgO), chromium oxide ($CrO_x$), zirconium oxide ($ZrO_2$), niobium oxide ($Nb_2O_5$), tin oxide ($SnO_2$), and vanadium oxide ($VO_x$). Other examples include various resins such as polyimide resin, epoxy resin, and acrylic resin, insulating materials with a low dielectric constant such as SiOCH, organic SOG, and fluorine-based resin (for example, materials with a dielectric constant $k(=\epsilon/\epsilon_0)$) of, for example, 3.5 or less, specifically, for example, fluorocarbons, cycloperfluorocarbon polymers, benzocyclobutene, cyclic fluororesins, polytetrafluoroethylene, amorphous tetrafluoroethylene, polyaryl ethers, fluoroaryl ethers, fluorinated polyimide, amorphous carbon, parylene (polyparaxylylene), and fluorinated fullerenes), and also Silk (a trademark of The Dow Chemical Co., a coating type low dielectric constant interlayer insulating film material), Flare (a trademark of Honeywell Electronic Materials Co., polyallyl ether (PAE)-based material). These can be used alone or in combination as appropriate. The insulating layer, interlayer insulating layer, and substrate can be formed by well-known methods such as various CVD methods, various coating methods, various PVD methods including a sputtering method and a vacuum vapor deposition method, various printing methods such as a screen printing method, a plating method, an electrodeposition method, a dipping method, and a sol-gel method.

In an organic EL panel, it is desirable that the thickness of the hole transport layer (hole supply layer) and the thickness of the electron transport layer (electron supply layer) be approximately equal. Alternatively, the electron transport layer (electron supply layer) may be thicker than the hole transport layer (hole supply layer), which is necessary for high efficiency at a low drive voltage and enables sufficient supply of electrons to the luminescent layer. That is, the hole supply can be increased by arranging the hole transport layer between the first electrode corresponding to the anode electrode and the luminescent layer and forming the hole transport layer with a film thickness smaller than that of the electron transport layer. As a result, it is possible to obtain a carrier balance in which there is no excess or deficiency of holes and electrons and the amount of carrier supply is sufficiently large, so that high luminous efficiency can be obtained. Further, since there is no excess or deficiency of holes and electrons, the carrier balance is unlikely to be lost, drive deterioration is suppressed, and the light emission life can be extended.

EXAMPLE 1

Figure 2A:
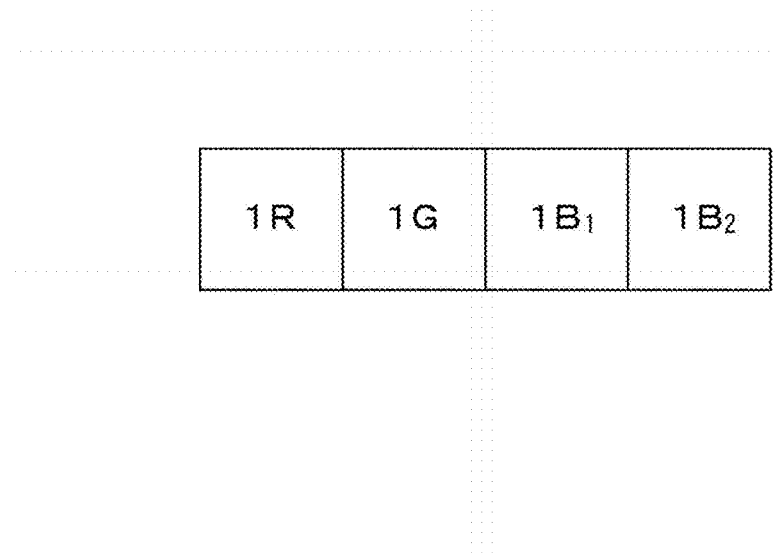
FIGS. 2A and 2B are diagrams showing a schematic arrangement of four panels constituting the projection type display device of Example 1.
Figure 2B:
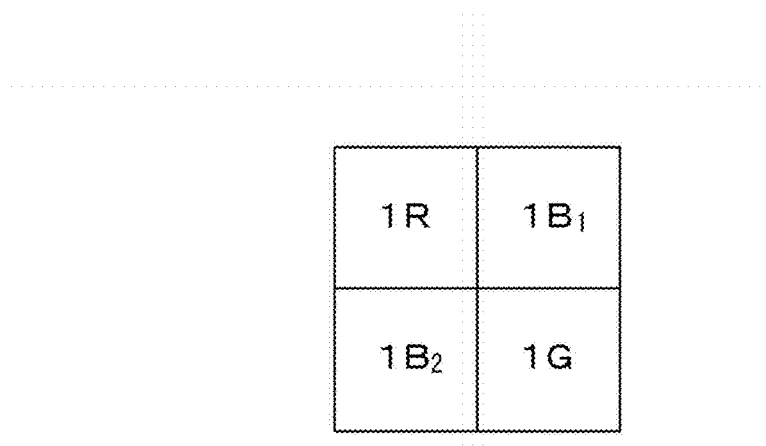
Figure 3:
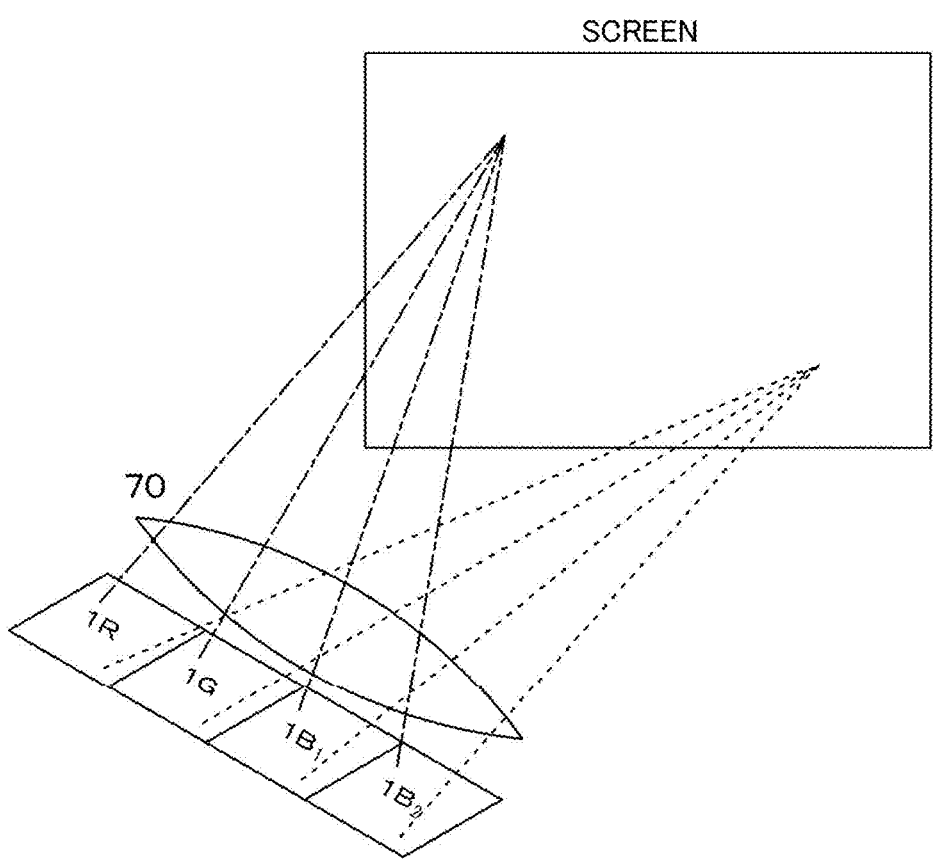
FIG. 3 is a diagram schematically showing an image projection state of four panels constituting the projection type display device of Example 1 shown in FIG. 2A.
Figure 4:
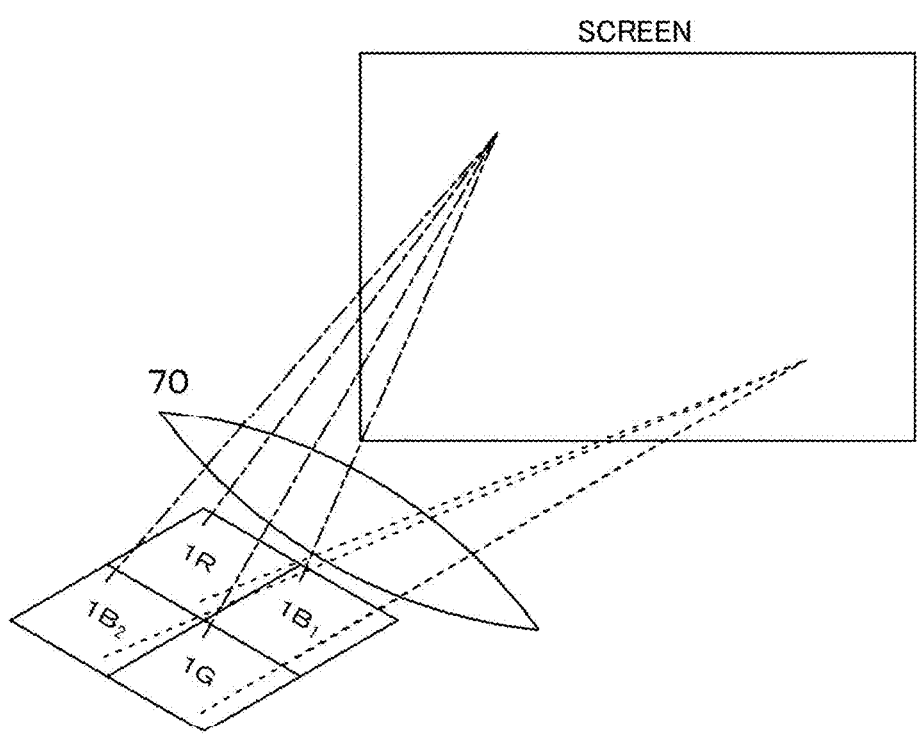
FIG. 4 is a diagram schematically showing an image projection state of four panels constituting the projection type display device of Example 1 shown in FIG. 2B.
Figure 13A:
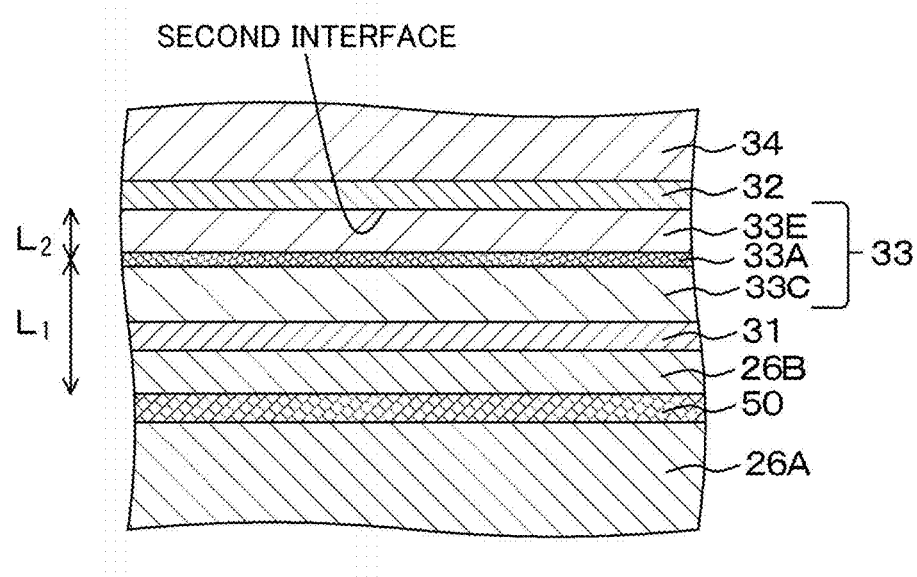
FIGS. 13A and 13B are schematic partial cross-sectional views of the light emitting elements of Example 1 and Example 2, respectively.

Example 1 relates to a light emitting element according to the second aspect of the present disclosure, and to a projection type display device (projector) according to the second aspect and the third aspect of the present disclosure. FIG. 1 shows a schematic partial cross-sectional view of the light emitting element of Example 1 and a panel constituting the projection type display device of Example 1, FIGS. 2A and 2B show a schematic arrangement of the four panels constituting the projection type display device of Example 1, and FIGS. 3 and 4 schematically show the image projection state of the four panels constituting the projection type display device of Example 1 shown in FIGS. 2A and 2B. FIG. 13A shows a schematic partial cross-sectional view of the light emitting element of Example 1.

A light emitting element 10 of Example 1 includes
a first electrode 31,
an organic layer 33 formed on the first electrode 31 and including a luminescent layer 33A composed of an organic luminescent material, and a second electrode 32 formed on the organic layer 33, and further includes a light reflecting layer 50 provided below the first electrode 31, wherein light emitted in the luminescent layer 33A is resonated between the light reflecting layer 50 and an interface (second interface) of the second electrode 32 and the organic layer 33, and a portion of the light is output from the second electrode 32.

Further, the projection type display device of Example 1 is configured of a panel comprising:

a first substrate 11;

a second substrate 41; and a plurality of light emitting elements 10 sandwiched between the first substrate 11 and the second substrate 41, wherein each light emitting element 10 includes the first electrode 31, the organic layer 33 formed on the first electrode 31 and including the luminescent layer 33A composed of an organic luminescent material, and the second electrode 32 formed on the organic layer 33, and each light emitting element 10 further includes the light reflecting layer 50 provided below the first electrode 31, wherein light emitted in the luminescent layer 33A is resonated between the light reflecting layer 50 and an interface (second interface) of the second electrode 32 and the organic layer 33, and a portion of the light is output from the second electrode 32.

Alternatively, the projection type display device of Example 1 is configured of a panel comprising:

a first substrate 11;

a second substrate 41; and a plurality of light emitting elements sandwiched between the first substrate 11 and the second substrate 41, wherein each light emitting element is configured of the light emitting element 10 of Example 1.

The projection type display device of Example 1 or Examples 2 and 3 described hereinbelow is configured of one red light outputting panel (first panel 1R) that outputs red light, one green light outputting panel (second panel 1G) that outputs green light, and one blue light outputting panel (third panel $1B_1$) that outputs blue light, and further includes one blue light outputting panel (fourth panel $1B_2$) that outputs blue light and is thus configured of four panels 1R, 1G, $1B_1$, $1B_2$. A projection lens system 70 is provided on the light outputting side of the projection type display device. The four panels may be arranged in an array (1×4 state) as shown in FIGS. 2A and 3, or the four panels may be arranged in a 2×2 state as shown in FIGS. 2B and 4. In FIGS. 3 and 4, the light rays output from the panel are indicated by dotted lines and dash-dot lines. The number of pixels of the panel is, for example, 1920×1080, and one light emitting element 10 constitutes one pixel. The size of the panel is, for example, 10 mm×10 mm.

A lens having a high F number and a high depth of field (DOF) is preferably used as a lens constituting the projection lens system 70. Further, the light incident on the projection lens system 70 or the image synthesizing means is preferably parallel light with respect to the optical axis of the lens in the paraxial region of the lens. When a lens with a high F number is used in the projection lens system 70, it is necessary to reduce the divergence angle (direction half-value angle) of the light output from the light emitting element. For that purpose, an on-chip microlens may be provided on the light outputting side of the light emitting element or the resonator structure may be optimized. In particular, since the light output from the peripheral portion of the panel is incident on the peripheral portion of the lens, it is preferable to provide an on-chip microlens in order to optimize the incidence of such light on the lens.

In Example 1 or Examples 2 to 3 described hereinbelow, the panel constituting the projection type display device is composed of an organic EL panel, the light emitting element 10 is composed of an organic EL element, and the organic layer 33 is composed of an organic electroluminescence layer. Further, the organic EL panel is a top emission type organic EL panel that outputs light from the second substrate 41, and the light from the organic layer 33 is output to the outside via the second substrate 41.

Each panel outputs monochromatic light. The luminescent layer in the light emitting element constituting the first panel 1R is composed of a red luminescent layer that emits red light, and the light output from the first panel 1R is red light (has an emission spectrum peak within the range of red light with a wavelength of 620 nm to 750 nm). Specifically, the peak wavelength $\lambda_R$ is as shown in Table 1 below. Further, the luminescent layer in the light emitting element constituting the second panel 1G is composed of a green luminescent layer that emits green light, and the light output from the second panel 1G is green light (has an emission spectrum peak within the range of green light with a wavelength of 495 nm to 570 nm). Specifically, the peak wavelength $\lambda_G$ is as shown in Table 1 below. Further, the luminescent layer in the light emitting element constituting the third panel $1B_1$ and the fourth panel $1B_2$ is composed of a blue luminescent layer that emits blue light, the light output from the third panel $1B_1$ and the fourth panel $1B_2$ is blue light (has an emission spectrum peak within the range of green light with a wavelength of 450 nm to 495 nm), and the peak wavelength $\lambda_B$ is as shown in Table 1 below.

Here, the light emitting element 10 of Example 1 satisfies the above-mentioned formulas (1-1) and (1-2). Specifically, $m_1=m_2=1$. However, these values are not limiting, and for example, $m_1=m_2=0$ can be set. The values of the optical distance $(OL_1+OL_2)$ obtained from the formulas (1-1) and (1-2) are shown in Table 1 below.

TABLE 1

| | $m_1$ | $m_2$ | Peak wavelength, λ | $OL_1 + OL_2$ |
|---|---|---|---|---|
| First panel | 1 | 1 | 530 nm | 280 nm |
| Second panel | 1 | 1 | 630 nm | 230 nm |
| Third panel/Fourth panel | 1 | 1 | 440 nm | 170 nm |

The second electrode 32 is covered with a protective layer (planarizing layer) 34 made of an acrylic resin. A lens member (on-chip lens) 60 is arranged on the light outputting side of the organic layer 33. That is, the lens member (on-chip microlens) 60 composed of a well-known material is formed on the protective layer 34 by a well-known method. The light output from the lens member (on-chip lens) 60 is converted into parallel light. The protective layer 34 and the lens member 60 are attached to the second substrate 41 through the sealing resin layer 35. Examples of the materials constituting the sealing resin layer 35 include thermosetting adhesives such as acrylic adhesives, epoxy adhesives, urethane adhesives, silicone adhesives, and cyanoacrylate adhesives, and ultraviolet curable adhesives. In a possible, but not limiting, embodiment, the lens member (on-chip lens) 60 has a plano-convex lens shape, and in the illustrated example, the convex surface is located on the second substrate side. Further, the convex surface can be spherical or aspherical, and the planar shape of the lens member (on-chip lens) 60 may be made to have a shape suitable to a planar shape of the light emitting region, such as a circle, an ellipse, or a rectangle with rounded corners (corner portions).

A light reflecting layer 50 made of Al—Cu, Ag, or Ag—Cu is formed inside the substrate (interlayer insulating layer) 26 composed of $SiO_2$ formed based on the CVD method. That is, the substrate (interlayer insulating layer) 26 is configured of two layers, a lower interlayer insulating layer 26A and an upper interlayer insulating layer 26B, and the light reflecting layer 50 is located between the lower interlayer insulating layer 26A and the upper interlayer insulating layer 26B. When the light reflecting layer 50 is configured of silver (Ag), for example, a base film composed of TiN is preferably formed on the lower interlayer insulating layer 26A in order to control the crystal state of the light reflecting layer 50 to be formed. It is not necessary to form a TiN layer on the light reflecting layer 50. Further, the lower interlayer insulating layer and the upper interlayer insulating layer may be configured of the same material, or may be configured of different materials in order to set $OL_1$ to an appropriate value.

Further, a light emitting element drive unit is provided below the substrate (interlayer insulating layer) 26. The light emitting element drive unit may have a well-known circuit configuration. The light emitting element drive unit is configured of a transistor (specifically, a MOSFET) formed on a silicon semiconductor substrate corresponding to the first substrate 11. The transistor 20 composed of the MOSFET includes a gate insulating layer 22 formed on the first substrate 11, a gate electrode 21 formed on the gate insulating layer 22, a source/drain region 24 formed on the first substrate 11, a channel forming region 23 formed within the source/drain region 24, and an element separation region 25 surrounding the channel forming region 23 and the source/drain region 24. The transistor 20 and the first electrode 31 are electrically connected to each other via a contact plug 27 provided in the substrate 26. In the drawings, one transistor 20 is shown for each light emitting element drive unit.

The second electrode 32 is connected to the light emitting element drive unit via a contact hole (contact plug) (not shown) formed in the substrate (interlayer insulating layer) 26 on the outer peripheral portion of the organic EL panel. On the outer peripheral portion of the organic EL panel, an auxiliary electrode connected to the second electrode 32 may be provided below the second electrode 32, and the auxiliary electrode may be connected to the light emitting element drive unit.

The first electrode 31 functions as an anode electrode, and the second electrode 32 functions as a cathode electrode. The first electrode 31 is composed of a light transmitting material, and the second electrode 32 is composed of a semi-light transmitting material. Specifically, the first electrode 31 is composed of a transparent conductive material layer, more specifically, ITO or IZO, and the second electrode 32 is composed of silver (Ag). The first electrode 31 is formed based on the combination of the vacuum vapor deposition method and the etching method on the substrate (interlayer insulating layer) 26. Further, the second electrode 32 is formed by a film forming method, in particular, such as a vacuum vapor deposition method in which the energy of the film-forming particles is small, and is not patterned. The organic layer 33 is also not patterned. However, the present invention is not limited to this, and the organic layer 33 may be patterned.

In Example 1, the organic layer 33 has a layered structure of, for example, a hole injection layer (HIL), a hole transport layer (HTL), the luminescent layer 33A, an electron transport layer (ETL), and an electron injection layer (EIL). In FIG. 13A, the hole injection layer and the hole transport layer are collectively shown by reference number 33C, and the electron transport layer and the electron injection layer are collectively shown by reference number 33E.

The hole injection layer is a layer that enhances the hole injection efficiency and also functions as a buffer layer that prevents leaks, and has a thickness of, for example, about 2 nm to 10 nm. The hole injection layer is composed of, for example, a hexaazatriphenylene derivative represented by the following formula (A) or formula (B). When the end face of the hole injection layer is in contact with the second electrode, it becomes a main cause of luminance variation between pixels and leads to deterioration of display image quality.

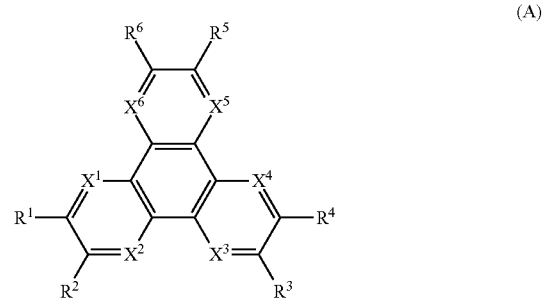

(A)

Here, $R^1$ to $R^6$ are independently hydrogen, halogen, hydroxy group, amino group, arulamino group, substituted or unsubstituted carbonyl group having 20 or less carbon atoms, substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxy group having 20 or less carbon atoms, a substituted or unsubstituted aryl group having 30 or less carbon atoms, a substituted or unsubstituted heterocyclic group having 30 or less carbon atoms, a nitrile group, a cyano group, a nitro group, or a silyl group, and adjacent $R^m$ (m=1 to 6) may be bonded to each other via a cyclic structure. Further, $X^1$ to $X^6$ are independently carbon or nitrogen atoms, respectively.

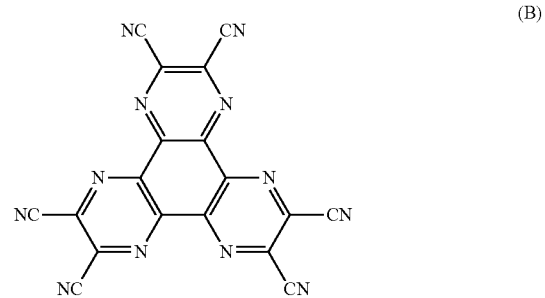 [SMILES: N#Cc1nc2c3nc(C#N)c(C#N)nc3c3nc(C#N)c(C#N)nc3c2nc1C#N]

(B)

The hole transport layer is a layer that enhances the hole transport efficiency to the luminescent layer 33A. In the luminescent layer 33A, where an electric field is applied, recombination of electrons and holes occurs to generate light. The electron transport layer is a layer that enhances the electron transport efficiency to the luminescent layer 33A, and the electron injection layer is a layer that enhances the electron injection efficiency into the luminescent layer 33A.

The hole transport layer is composed of, for example, 4,4',4"-tris (3-methylphenylphenylamino)triphenylamine (m-MTDATA) or α-naphthylphenyldiamine (αNPD) having a thickness of about 40 nm.

In the red luminescent layer, when an electric field is applied, some of the holes injected from the first electrode 31 and some of the electrons injected from the second electrode 32 are recombined, and red light is generated. Such a red luminescent layer includes, for example, at least one kind of material among a red luminescent material, a hole transport material, an electron transport material and an amphoteric charge transport material. The red luminescent material may be a fluorescent material or a phosphorescent material. The red luminescent layer having a thickness of about 5 nm is composed of, for example, 4,4-bis(2,2-diphenylvinyl)biphenyl (DPVBi) mixed with 30% by mass of 2,6-bis[(4'-methoxydiphenylamino)styryl]-1,5-dicyanon-aphthalene (BSN).

In the green luminescent layer, when an electric field is applied, some of the holes injected from the first electrode 31 and some of the electrons injected from the second electrode 32 are recombined, and green light is generated. Such a green luminescent layer includes, for example, at least one kind of material among a green luminescent material, a hole transport material, an electron transport material and an amphoteric charge transport material. The green luminescent material may be a fluorescent material or a phosphorescent material. The green luminescent layer having a thickness of about 10 nm is composed of, for example, DPVBi mixed with 5% by mass of coumarin 6.

In the blue luminescent layer, when an electric field is applied, some of the holes injected from the first electrode 31 and some of the electrons injected from the second electrode 32 are recombined, and blue light is generated. Such a blue luminescent layer includes, for example, at least one kind of material among a blue luminescent material, a hole transport material, an electron transport material and an amphoteric charge transport material. The blue luminescent material may be a fluorescent material or a phosphorescent material. The blue luminescent layer having a thickness of about 30 nm is composed of, for example, DPVBi mixed with 2.5% by mass of 4,4'-bis[2-{4-(N,N-diphenylamino)phenyl}vinyl]biphenyl (DPAVBi).

The electron transport layer having a thickness of about 20 nm is composed of, for example, 8-hydroxyquinoline aluminum (Alq3). The electron injection layer having a thickness of about 0.3 nm is composed of, for example, LiF or $Li_2O$.

However, the materials that make up each layer are exemplary, and are not limiting. Where the luminescent layer 33A is configured of a phosphorescent material, it is possible to increase the luminance by about 2.5 to 3 times as compared with the case where the luminescent layer 33A is configured of a fluorescent material. The luminescent layer 33A can also be made of a thermally activated delayed fluorescence (TADF) material.

The outline of the method for manufacturing of the light emitting element 10 of Example 1 shown in FIG. 1 will be described hereinbelow.

[Step-100]
First, a light emitting element drive unit is formed on a silicon semiconductor substrate (first substrate 11) on the basis of a known MOSFET manufacturing process.

[Step-110]
Next, a substrate (interlayer insulating layer) 26 is formed on the entire surface. Specifically, first, the lower interlayer insulating layer 26A is formed based on a CVD method, the light reflecting layer 50 is formed on the lower interlayer insulating layer 26A on the basis of a sputtering method, the light reflecting layer 50 is patterned on the basis of an etching method, and then upper interlayer insulating layer 26B is formed on the lower interlayer insulating layer 26A and the light reflecting layer 50 on the basis of a CVD method. The illustrated interlayer insulating layer 26 is configured of the lower interlayer insulating layer 26A and the upper interlayer insulating layer 26B.

[Step-120]
Then, a connection hole is formed in the portion of the substrate 26 (including the light reflecting layer 50) located above one source/drain region of the transistor 20 on the basis of photolithography technique and etching technique. Then, the first electrodes 31 can be formed on a portion of the substrate 26 by forming a metal layer on the substrate 26 including the connection holes on the basis of, for example, a sputtering method, and then patterning the metal layer on the basis of photolithography technique and etching technique. The first electrode 31 is separated for each light emitting element. At the same time, a contact hole (contact plug) 27 for electrically connecting the first electrode 31 and the transistor 20 can be formed in the connection hole. The contact hole (contact plug) 27 is made of, for example, tungsten (W). The light reflecting layer 50 is connected to the contact hole (contact plug) 27.

[Step-130]
Next, for example, after forming the insulating layer 28 on the entire surface on the basis of a CVD method, the insulating layer 28 is left on the substrate 26 between the first electrode 31 and the first electrode 31 on the basis of photolithography technique and etching technique.

[Step-140]
After that, the organic layer 33 is formed on the first electrodes 31 and the insulating layer 28 by, for example, a PVD method such as a vacuum deposition method or a sputtering method, a coating method such as a spin coating method or a die coating method, or the like. In some cases, the organic layer 33 may be patterned into a desired shape.

[Step-150]
Next, the second electrode 32 is formed on the entire surface on the basis of, for example, a vacuum vapor deposition method. In some cases, the second electrode 32 may be patterned into a desired shape. In this way, the organic layer 33 and the second electrode 32 can be formed on the first electrode 31.

[Step-160]
Then, the protective layer 34 is formed on the entire surface on the basis of a coating method, and then the top surface of the protective layer 34 is planarized. Since the protective layer 34 can be formed based on the coating method, there are few restrictions on the processing process and the material selection range is wide. Then, the lens member 60 is formed on the protective layer 34 by a well-known method.

[Step-170]
Then, the protective layer 34, the lens member 60, and the second substrate 41 are bonded together by a sealing resin layer 35 composed of an acrylic adhesive. In this way, the light emitting element (organic EL element) 10 shown in FIG. 1 and the organic EL panel of Example 1 can be obtained.

Figure 12:
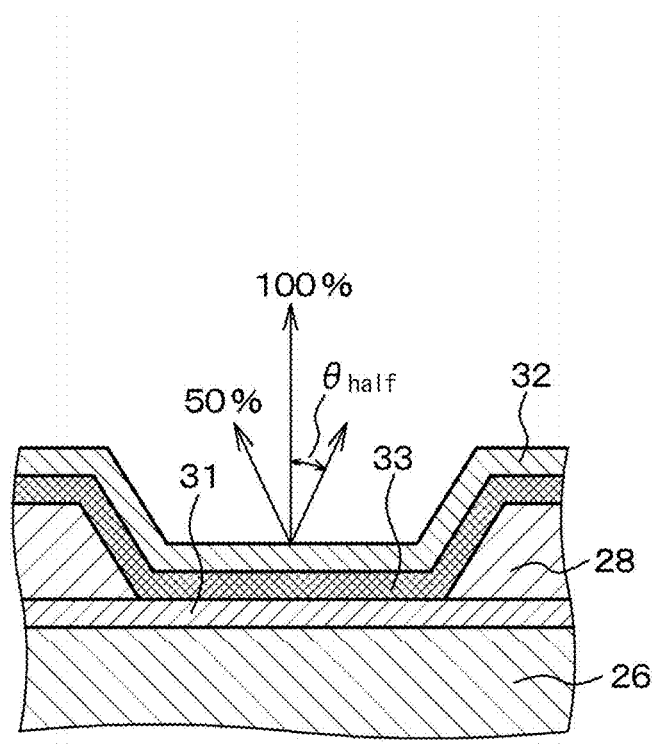
FIG. 12 is a diagram schematically showing an outputting state of light from a light emitting element.

The outputting state of light from the light emitting element 10 is schematically shown in FIG. 12 where the light beam is indicated by an arrow and the directional half-value angle is indicated by "$\theta_{half}$".

Here, in the conventional organic EL element, the luminescent layer constituting the organic EL element is configured by, for example, layering a red luminescent layer, a green luminescent layer and a blue luminescent layer, causing the output of white light, providing a red color filter layer to obtain a red light organic EL element 100R, providing a green color filter layer to obtain a green light organic EL element 100G, and providing a blue color filter layer to obtain a blue light organic EL element 100B. Such a layered structure of the red luminescent layer, the green luminescent layer, and the blue luminescent layer may be hereinafter referred to as an "RGB layered structure" for convenience. In addition, a resonator structure is adopted, and normally, the values of $m_1$ and $m_2$ in the formulas (1-1) and (1-2) are set to "0" or "1", respectively, but these values are not limiting.

Figure 17:
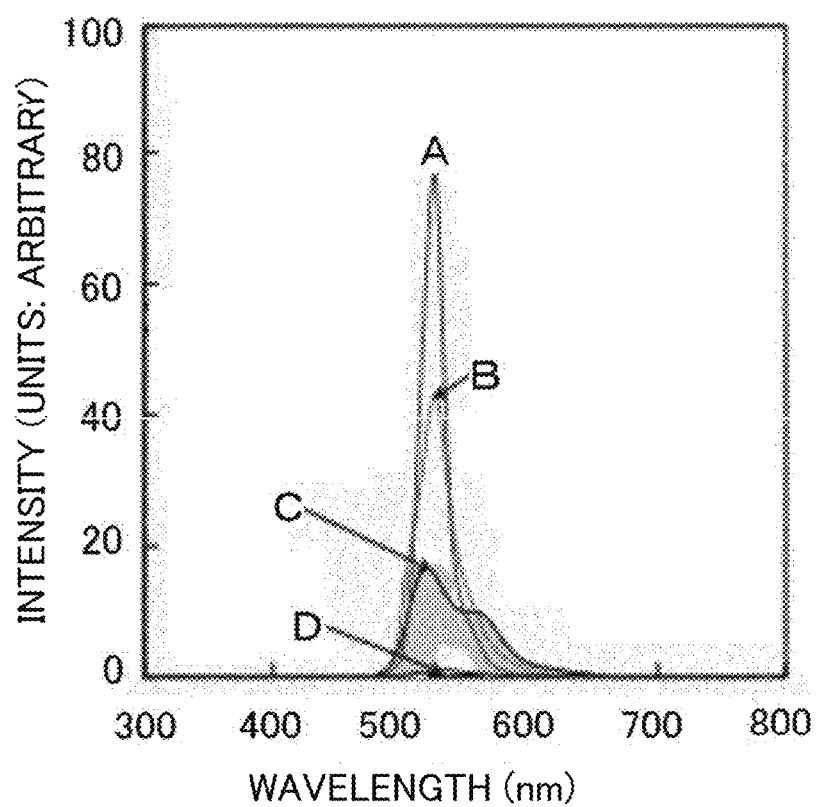
FIG. 17 is a graph showing the emission spectra of the light emitting elements of Examples 1, 2 and 3, and a conventional organic electroluminescence element.

In the light emitting element 10 of Example 1, when the light intensity (light intensity of the light output from the light emitting element 10) at the center line passing through the center of the light emitting unit of the light emitting element 10 is denoted by $I_0$ and the light intensity (light intensity of the light output from the light emitting element 10) at the center line passing through the center of the light emitting unit of the light emitting element 10 without the light reflecting layer 50 is denoted by $I_{conv}$, $I_0/I_{conv} \geq 5$ is satisfied. In FIG. 17, the emission spectra of the light emitting element of Example 1, the light emitting elements of Examples 2 and 3 described hereinbelow, and the conventional organic EL element are shown in the graph of FIG. 17. In FIG. 17, "A" indicates the emission spectrum of the light emitting element of Example 3, "B" indicates the emission spectrum of the light emitting element of Example 2, "C" indicates the emission spectrum of the light emitting element of Example 1, and "D" indicates the emission spectrum of the conventional organic EL element. From FIG. 17, in the light emitting device of Example 1, $I_0/I_{conv}=20$ In addition, in the light emitting element of Example 2 described hereinbelow, $I_0/I_{conv}=40$, and in the light emitting device of the third embodiment described hereinbelow, $I_0/I_{conv}=80$.

Figure 19A:
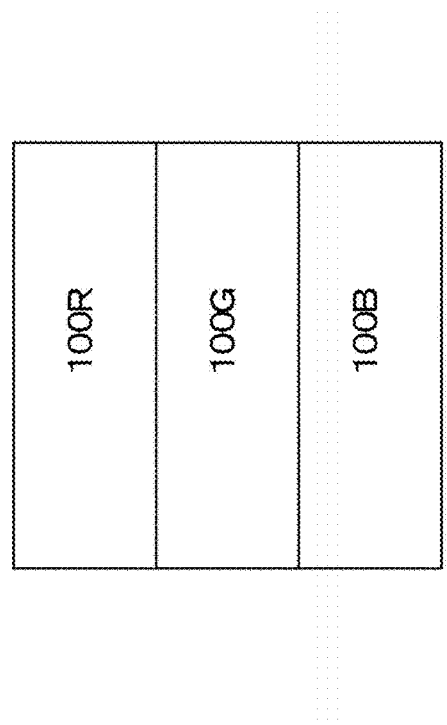
FIGS. 19A and 19B is a schematic arrangement diagram of three organic electroluminescence elements constituting one pixel of the conventional organic electroluminescence display device.
Figure 19B:
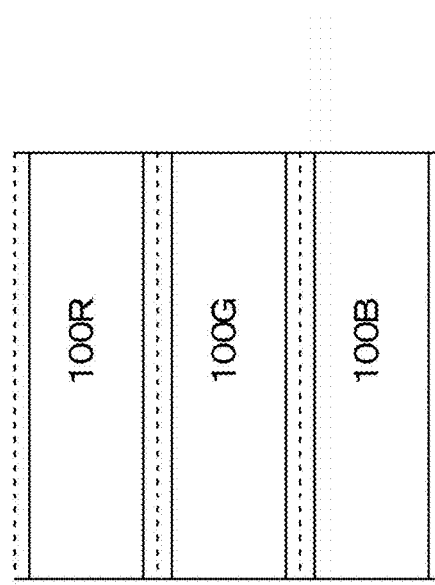

FIGS. 19A and 19B show a schematic arrangement diagram of the color filter layer and a schematic arrangement diagram of the light emitting region in the conventional organic EL element. Let "a" be the length of one side of one pixel having a square planar shape. The surface area occupied by the red light organic EL element 100R, the green light organic EL element 100G, and the blue light organic EL element 100B is $(1/3)a^2$. Further, since the red light organic EL element 100R, the green light organic EL element 100G, and the blue light organic EL element 100B are provided so as to be separated from each other, the light emitting region is, for example, $(1/3) \times 0.75 = 0.25a^2$. When the current flowing through these organic EL elements for light emission of the red light organic EL element 100R, the green light organic EL element 100G, and the blue light organic EL element 100B is taken as "1.00", for example, the ratio of the current flowing through the green light organic EL element 100G is, for example, "0.38". Further, each of the red light organic EL element 100R, the green light organic EL element 100G, and the blue light organic EL element 100B is provided with a color filter layer, and about 10% of the light emitted in the luminescent layer of the organic EL element is absorbed by the color filter layer. Therefore, the luminance efficiency of the conventional green light organic EL element 100G is (Ratio of current flowing through the green light organic EL element 100G)×(Light transmittance of the color filter layer)×(Ratio occupied by the light emitting region of the green light organic EL element 100G in one pixel) is=0.38×0.9× $0.25a^2=0.0855 \times a^2$.

Meanwhile, in the light emitting element 10 of Example 1, the ratio of the current flowing through the light emitting element 10 is 1.00, the color filter layer is not provided, and the area occupied by the light emitting element 10 in one pixel is $a^2$. Therefore, the luminance efficiency of the light emitting element 10 of Example 1 is 1/0.0855=12 times the luminance efficiency of the conventional green light organic EL element G. Actually, it is as shown in "C" and "D" of FIG. 17. Thus, the light emitting element 10 of Example 1 can achieve a very high luminance efficiency as compared with the conventional organic EL element.

Further, in the conventional organic EL element, it is difficult to design the maximum light emission position in the luminescent layer and to control the maximum light emission position at the time of manufacturing the luminescent layer. Further, the material constituting the blue luminescent layer generally has a shorter life than the materials constituting the red luminescent layer and the green luminescent layer. Therefore, when the light emission state of the blue luminescent layer deteriorates, the white chromaticity point moves from the desired chromaticity point, and the panel becomes unusable. That is, the life of the light emitting element having the RGB layered structure is defined by the material constituting the blue luminescent layer. In addition, when the RGB laminated structure is configured, unintended interference may occur.

Meanwhile, where the projection type display device of Example 1 is configured of four panels, namely, one red light outputting panel that outputs red light, one green light outputting panel that outputs green light, and two blue light outputting panels that output blue light, the drive current in the blue light outputting panel can be reduced, and as a result, the life of the blue light outputting panels can be extended. Moreover, since the life of the blue light outputting panels can be extended, the selection range and the degree of freedom of selection of the material constituting the luminescent layer of the light emitting element constituting the red light outputting panel and the green light outputting panel are increased. As described above, in Example 1, it is possible to provide a projection type display device capable of forming an image by self-luminous type light emitting elements, and also to provide a light emitting element suitable for use in such projection type display device or a planar light emitting device. Further, since the number of layers constituting the organic layer can be reduced as compared with the conventional organic EL element, the drive voltage of the light emitting element can be reduced.

Figure 5:
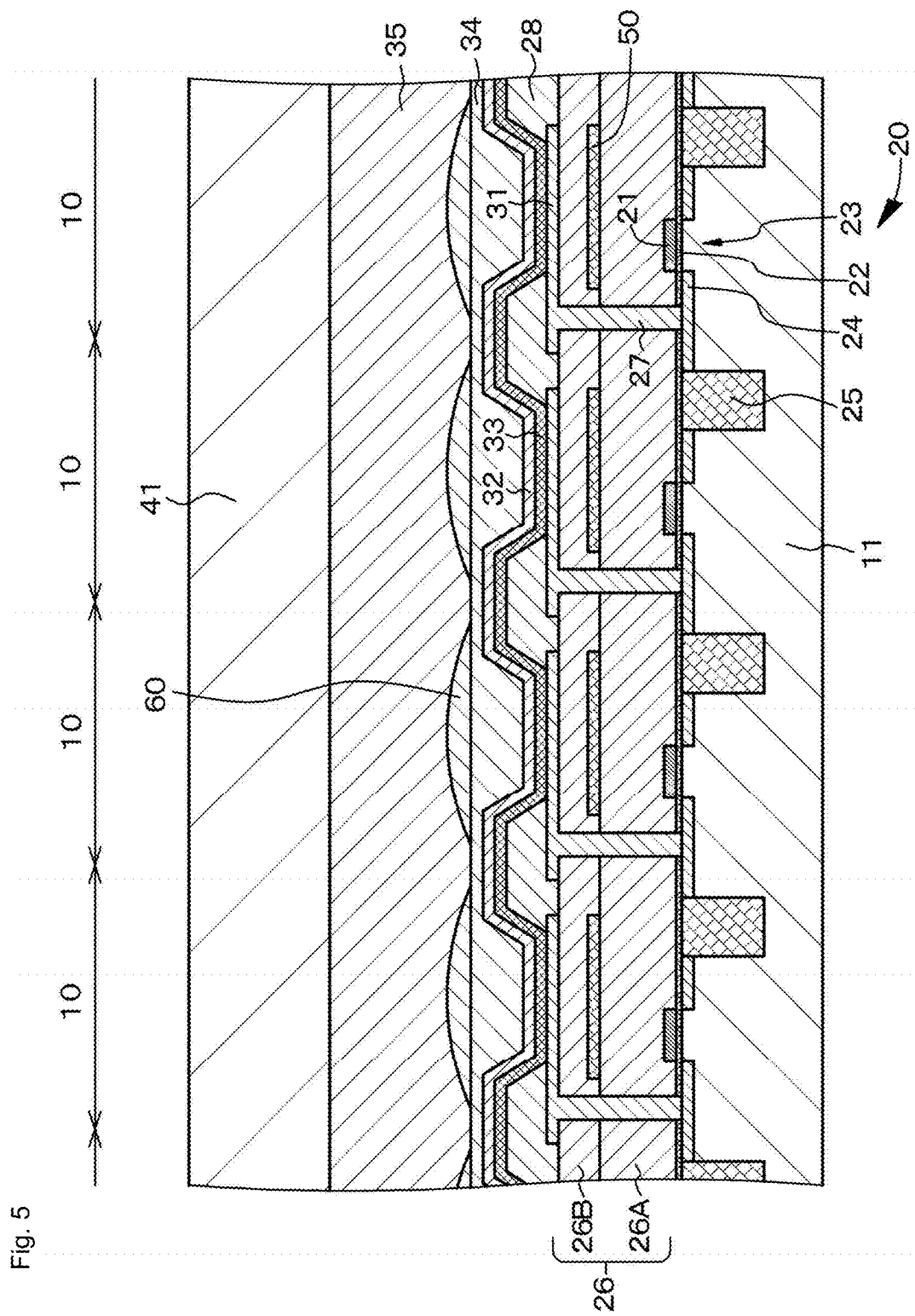
FIG. 5 is a schematic partial cross-sectional view of Modification Example 1 of the light emitting element of Example 1 and the panel constituting the projection type display device of Example 1.

FIG. 5 shows a schematic partial cross-sectional view of Modification Example 1 of the light emitting element of Example 1 and the panel constituting the projection type display device of Example 1. In the light emitting element 10 of Example 1 shown in FIG. 1, the light reflecting layer 50 was connected to the contact hole (contact plug) 27, but in the light emitting element 10 of Modification Example 1, the light reflecting layer 50 is not connected to the contact hole (contact plug) 27.

Figure 6:
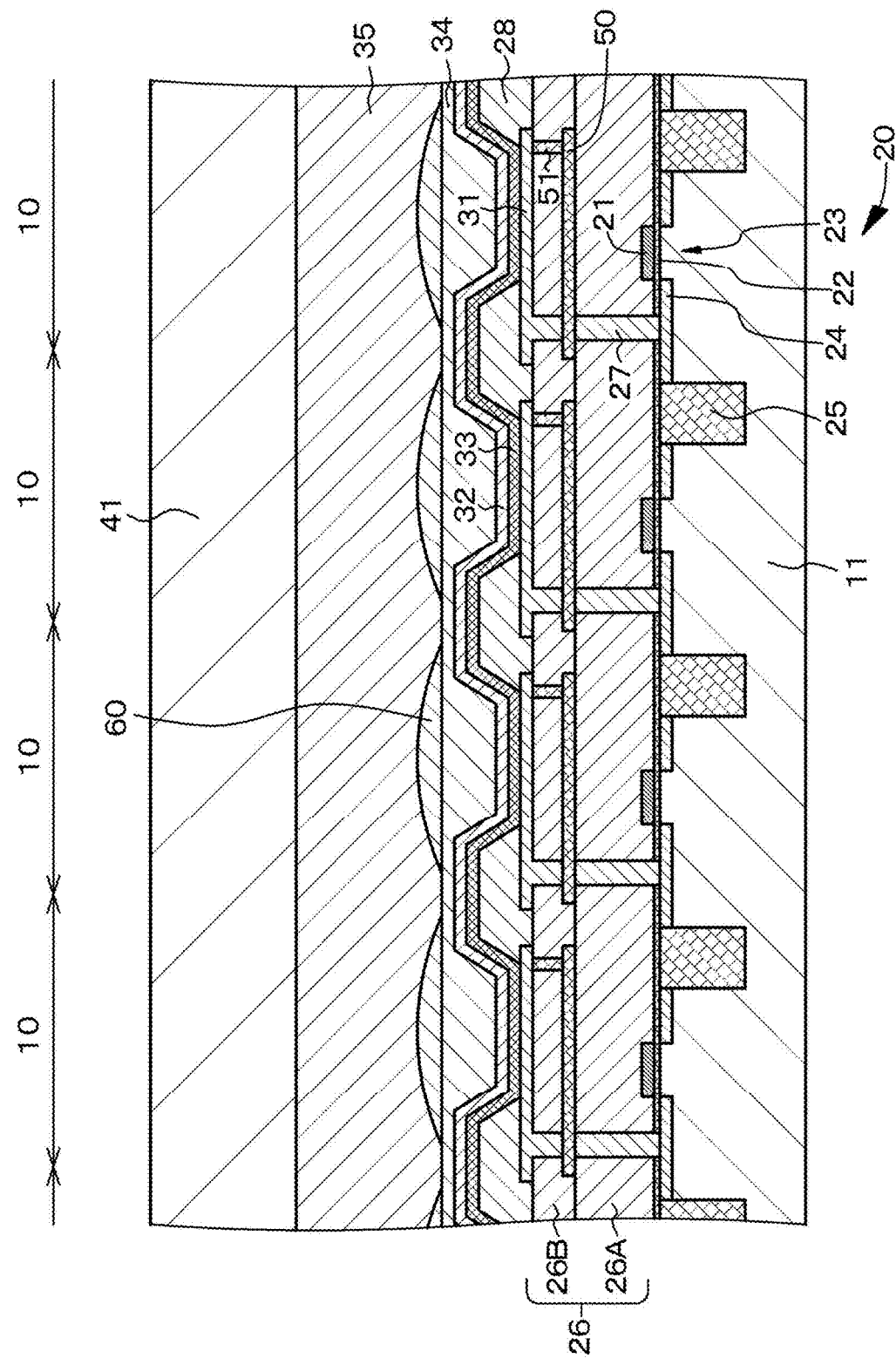
FIG. 6 is a schematic partial cross-sectional view of Modification Example 2 of the light emitting element of Example 1 and the panel constituting the projection type display device of Example 1.

FIG. 6 shows a schematic partial cross-sectional view of Modification Example 2 of the light emitting element 10 of Example 1 and the panel constituting the projection type display device of Example 1. In Modification Example 2, the first electrode 31 and the light reflecting layer 50 are surrounded by a light shielding portion or a light reflecting portion (reflector portion). A light shielding portion 51 is provided between the light emitting element 10 and the light emitting element 10, or a light reflecting portion 51 is provided. The light shielding portion 51 or the light reflecting portion 51 is connected to the light reflecting layer 50 and the first electrode 31.

Figure 7:
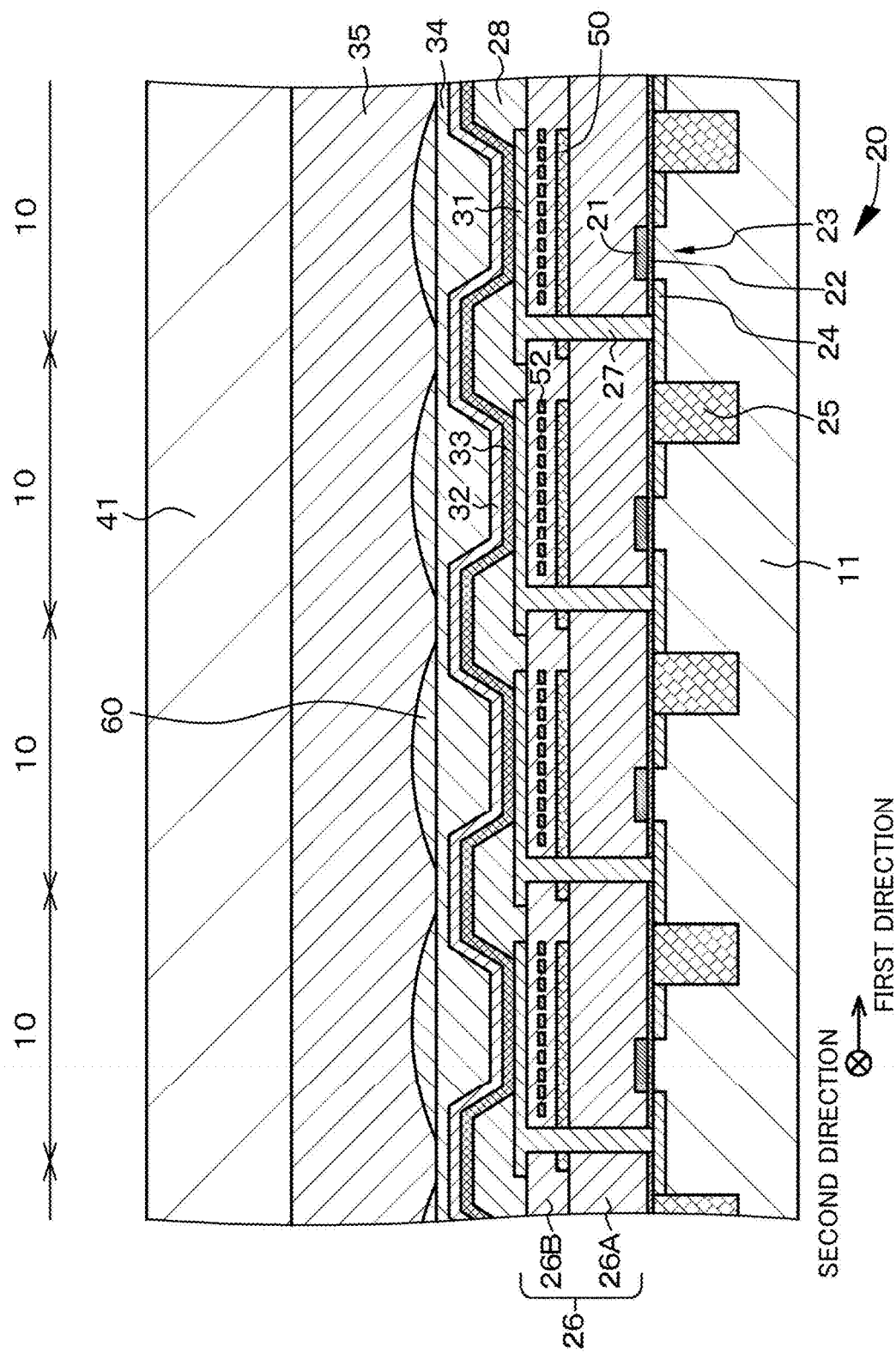
FIG. 7 is a schematic partial cross-sectional view of Modification Example 3 of the light emitting element of Example 1 and the panel constituting the projection type display device of Example 1.
Figure 8:
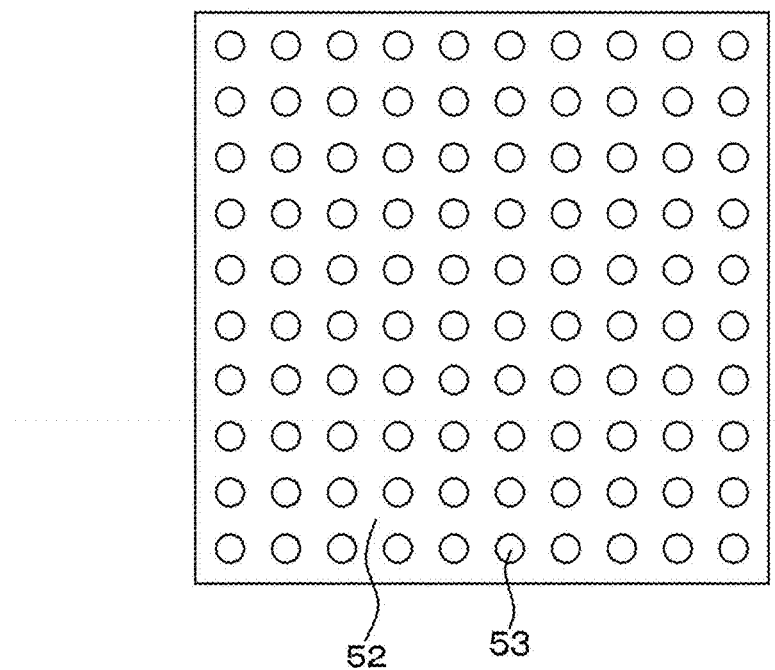
FIG. 8 is a plan view schematically showing a metal thin-film filter layer in the light emitting element of Example 1 and the panel constituting the projection type display device of Example 1 shown in FIG. 7.

FIG. 7 is a schematic partial cross-sectional view of Modification Example 3 of the light emitting element 10 of Example 1 and the panel constituting the projection type display device of Example 1, and FIG. 8 is a plan view schematically showing a metal thin-film filter layer in the light emitting element 10 of Example 1 and the panel constituting the projection type display device of Example 1. In this Modification Example 3, a metal thin-film filter layer 52 is further formed between the first electrode 31 and the light reflecting layer 50. The metal thin-film filter layer 52 is composed of, for example, a gold (Au) thin film or a silver (Ag) thin film, and a large number of pores 53 having a size of about 200 nm are formed and arranged two-dimensionally in these thin films.

Figure 9:
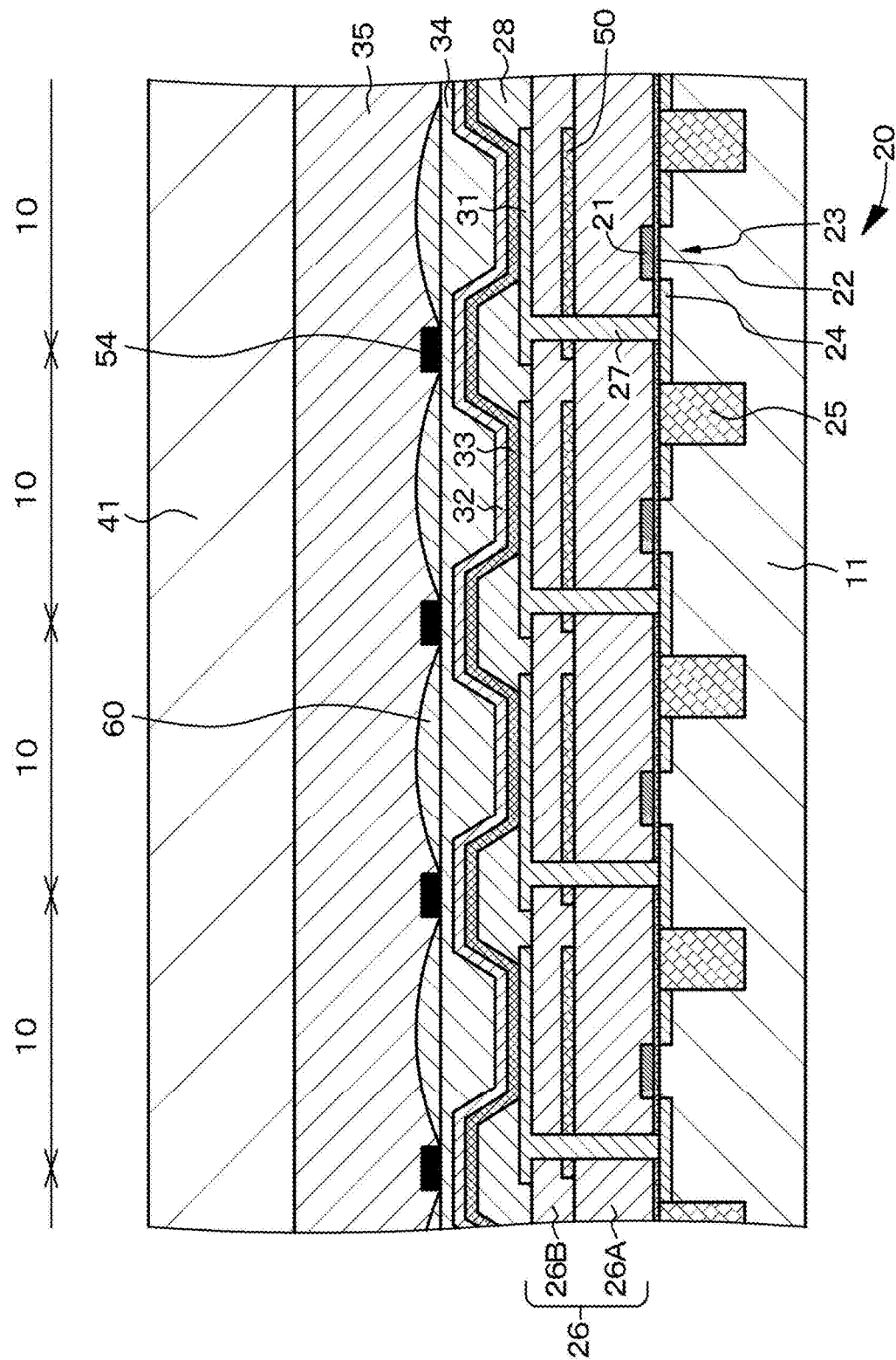
FIG. 9 is a schematic partial cross-sectional view of Modification Example 4 of the light emitting element of Example 1 and the panel constituting the projection type display device of Example 1.

FIG. 9 is a schematic partial cross-sectional view of Modification Example 4 of the light emitting element 10 of Example 1 and the panel constituting the projection type display device of Example 1. In Modification Example 4, a light absorption layer (black matrix layer) 54 is formed between the lens members (on-chip microlenses) 60 of the adjacent light emitting elements 10. As a result, the occurrence of partial duplication of unit pixels can be reliably suppressed.

Figure 10:
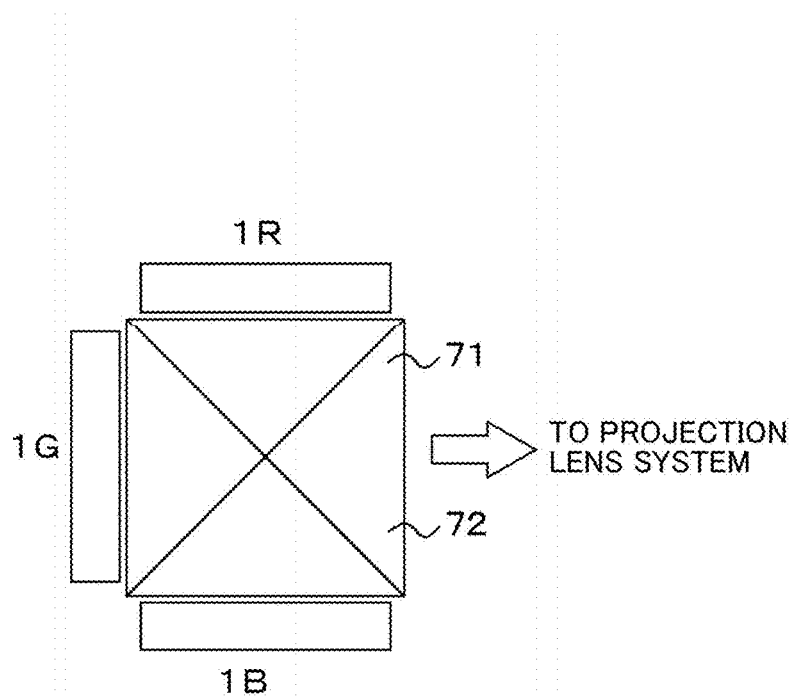
FIG. 10 is a conceptual diagram of Modification Example 5 of the panel constituting the projection type display device of Example 1.
Figure 11A:
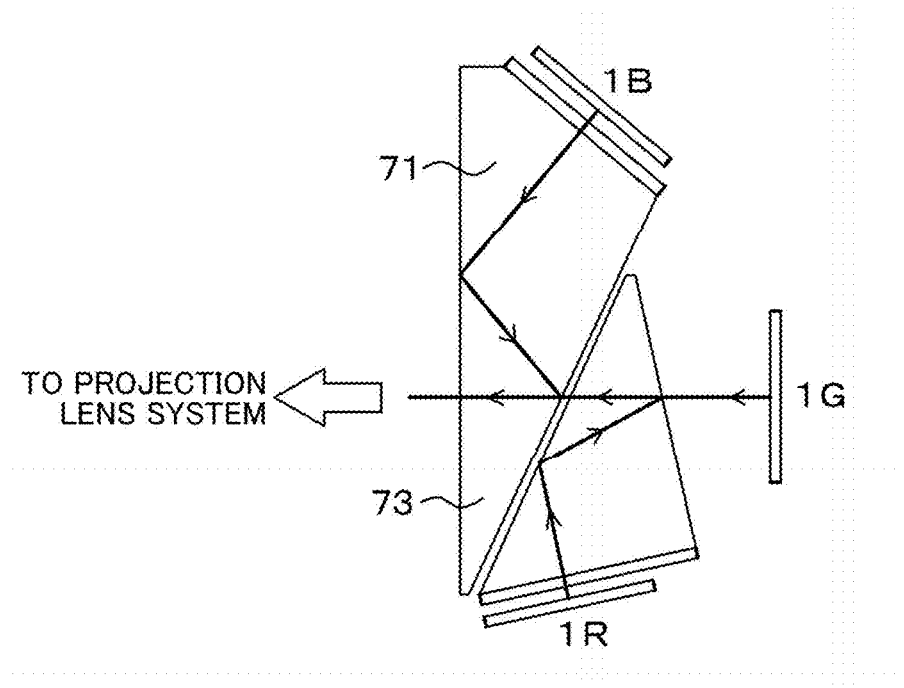
FIGS. 11A and 11B are conceptual diagrams of Modification Example 6 of the panel constituting the projection type display device of Example 1.
Figure 11B:
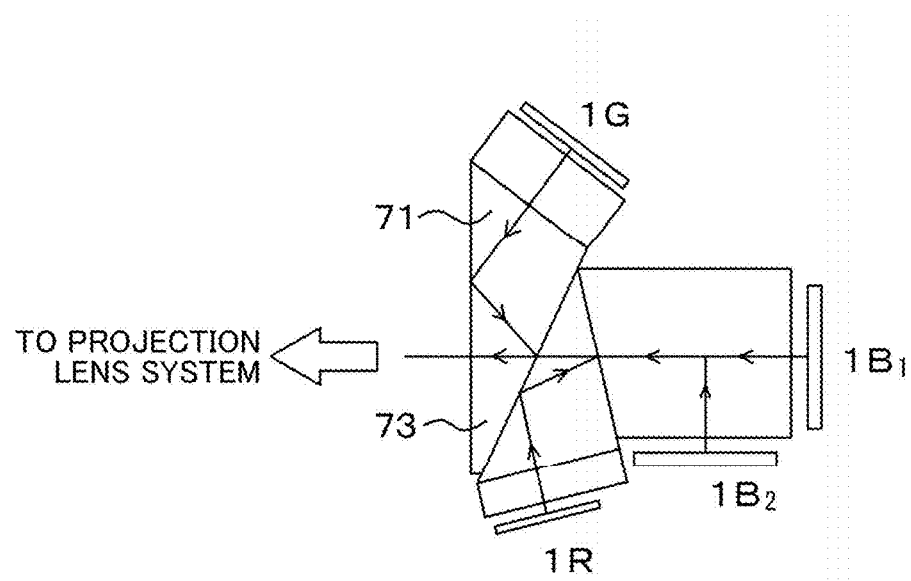

FIG. 10 is a conceptual diagram of Modification Example 5 of the panel constituting the projection type display device of Example 1. In Modification Example 5, there are provided an image synthesizing means 71 (specifically, an unpolarized dichroic prism 72) for synthesizing images output from a plurality of (specifically, three) panels 1R, 1G and 1B into one image, and a projection lens system 70 on the light outputting side of the image synthesizing means 71. Alternatively, FIGS. 11A and 11B are conceptual diagrams of Modification Example 6 of the panel constituting the projection type display device of Example 1, and in Modification Example 6, there are provided an image synthesizing means 71 (specifically, a Philips prism 73) for synthesizing images output from a plurality of (specifically, three or four) panels 1R, 1G and 1B (see FIG. 11A) or panels 1R, 1G, 1B$_1$, and 1B$_2$ (see FIG. 11B) into one image, and a projection lens system 70 on the light outputting side of the image synthesizing means 71. The Philips prism 73 has an air gap between the two prisms, but it can also be gapless without an air gap. Here, the light incident on the image synthesizing means 71 is preferably parallel light, whereby bright light can be made incident on the image synthesizing means 71, and three or four panels can be combined into one module.

EXAMPLE 2

Figure 13B:
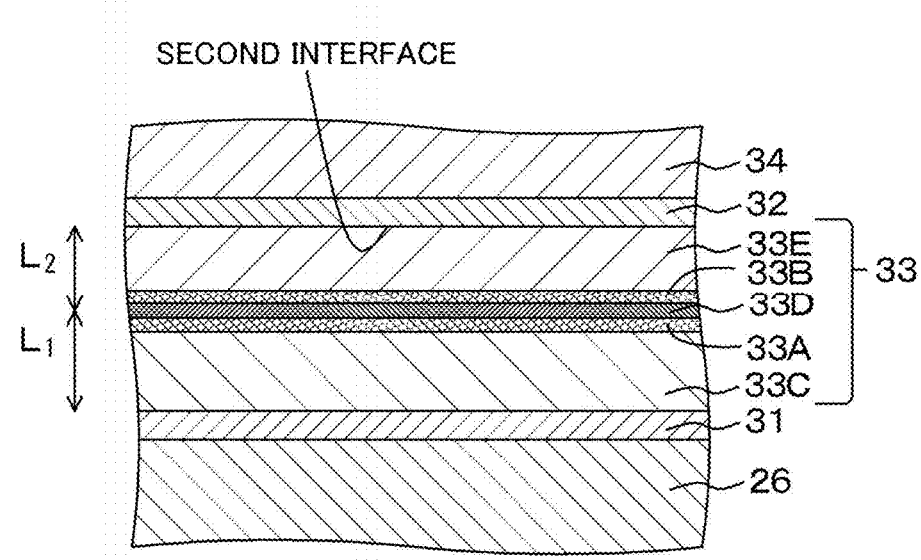
Figure 14:
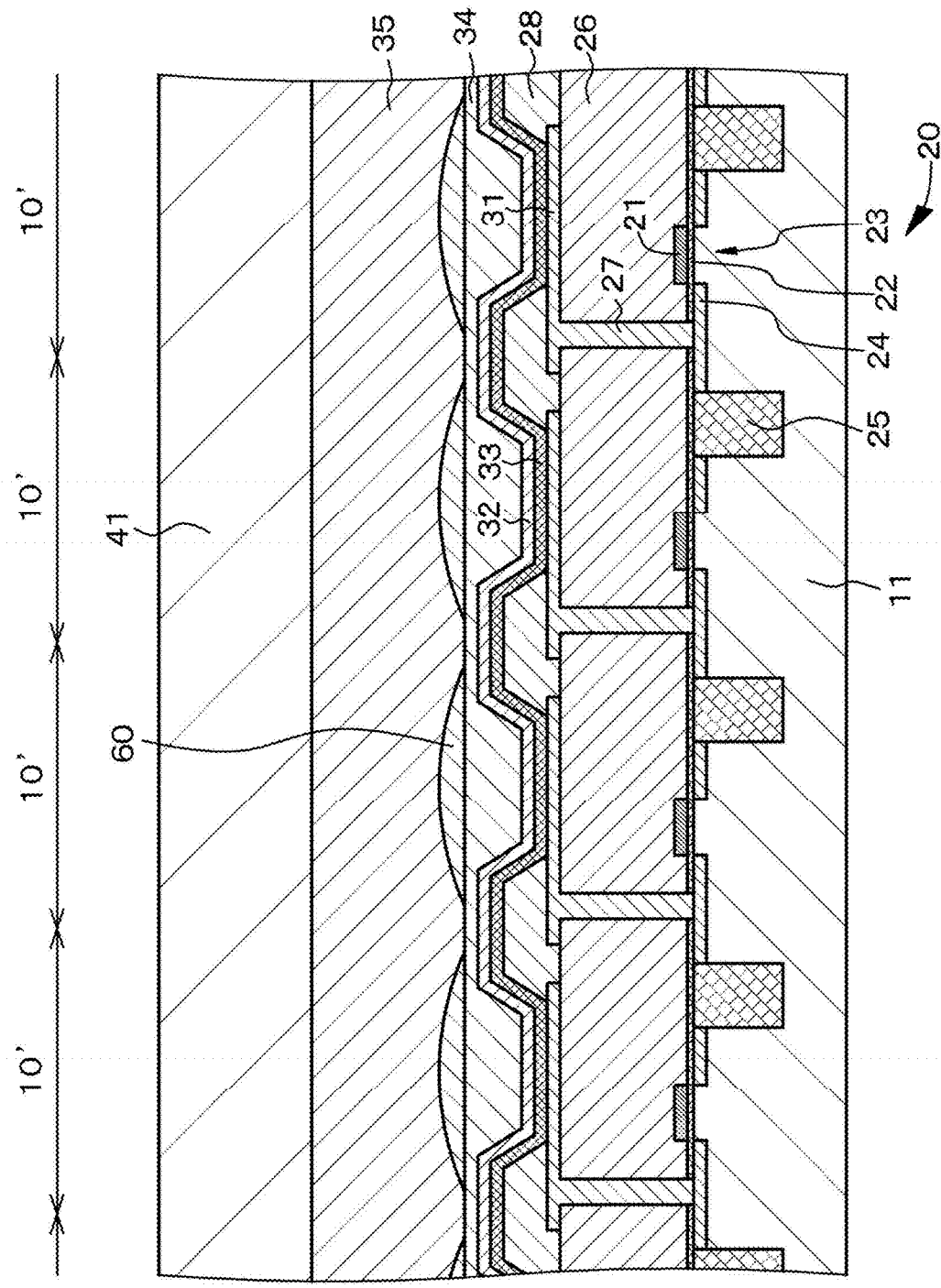
FIG. 14 is a schematic partial cross-sectional view of the light emitting element of Example 2 and the panel constituting the projection type display device of Example 2.

Example 2 relates to a light emitting element according to the first aspect of the present disclosure, and a projection type display device (projector) according to the first aspect and the third aspect of the present disclosure. A schematic partial cross-sectional view of the light emitting element of Example 2 is shown in FIG. 13B, and a schematic partial cross-sectional view of the panel constituting the light emitting element of Example 2 and the projection type display device of Example 2 is shown in FIG. 14.

A light emitting element 10' of Example 2 comprises:

a first electrode 31;

an organic layer 33 formed on the first electrode 31 and including a luminescent layer composed of an organic luminescent material; and a second electrode 32 formed on the organic layer 33, wherein the luminescent layer is configured by layering a plurality (specifically, two layers in Example 2) of luminescent layers 33A and 33B that emit light of the same color.

Further, the projection type display device of Example 2 is configured of a panel comprising:

a first substrate 11;

a second substrate 41; and a plurality of light emitting elements 10' sandwiched between the first substrate 11 and the second substrate 41, wherein each light emitting element 10' includes a first electrode 31;

an organic layer 33 formed on the first electrode 31 and including a luminescent layer composed of an organic luminescent material; and a second electrode 32 formed on the organic layer 33, the luminescent layer being configured by layering a plurality of luminescent layers 33A and 33B that emit light of the same color.

Alternatively, the projection type display device of Example 2 is configured of a panel comprising:

a first substrate 11;

a second substrate 41; and a plurality of light emitting elements sandwiched between the first substrate 11 and the second substrate 41, wherein each light emitting element is configured of the light emitting element 10' of Example 2.

Here, for example, an intermediate layer (charge generation layer) 33D composed of Li is formed between the luminescent layer 33A and the luminescent layer 33B on the basis of the sputtering method. The thickness of the intermediate layer 33D is, for example, 2 nm to 10 nm. The plurality of luminescent layers 33A and 33B have the same composition.

Figure 18A:
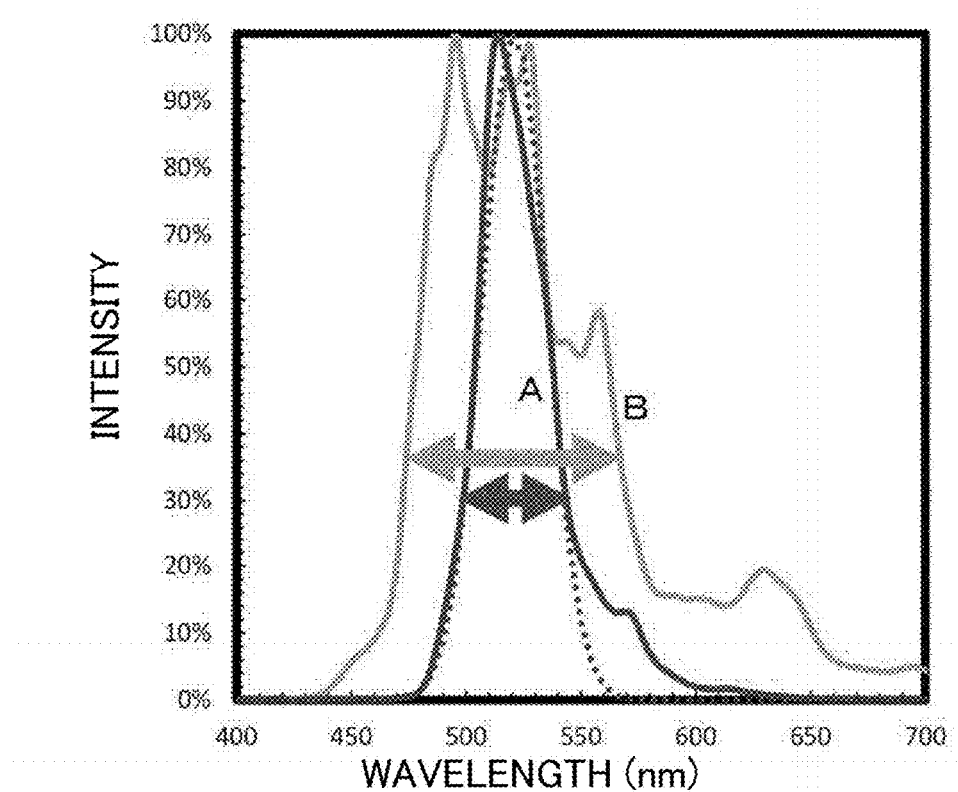
FIGS. 18A and 18B is a graph showing the emission spectra of Example 2 and the conventional organic electroluminescence element.
Figure 18B:
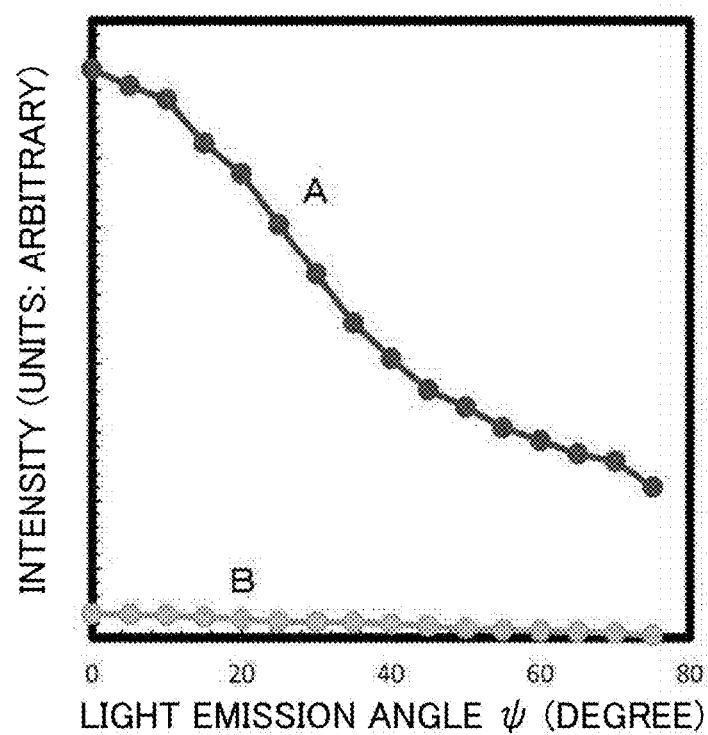

FIG. 18A shows the emission spectrum of the light emitting element of Example 2 (see "A" in FIG. 18A) and the emission spectrum of the conventional organic EL element (see "B" in FIG. 18A). Further, FIG. 18B shows the relationship between the light outputting angle Ψ from the center line passing through the center of the light emitting unit of the light emitting element and the light intensity (luminance). From FIG. 18B, it can be seen that the conventional organic EL element (see "B" in FIG. 18B) emits Lambersian radiation. Meanwhile, in the light emitting element 10 of Example 2 (see "A" in FIG. 18B), the directional half-value angle $\theta_{half}$ is 25 degrees or less (see also FIG. 12). The directional half-value angle of Lambersian radiation of the conventional organic EL element is about 70 degrees. That is, the light output from the light emitting element of Example 2 has higher directivity than the conventional organic EL element, or is close to parallel light.

As shown in FIG. 18B, in the light emitting element of Example 2, the value of $\theta$ can be made smaller than that of the conventional organic EL element. Therefore, the value of the electric field intensity $E_t$ of the light output from the second electrode 32 can be increased. That is, the light intensity from the light emitting element can be increased.

As shown in FIG. 18A, in the light emitting element 10 of Example 2, the value of the full width at half maximum (FWHM) of the light output from the light emitting element is 30 nm or less. That is, the light emitting element of Example 2 has a sharper light emission spectrum than the conventional organic EL element. In FIG. 18A, the full width at half maximum (FWHM) of the light emitting element 10 of Example 2 is indicated by a black arrow, and the full width at half maximum (FWHM) of the conventional organic EL element is indicated by a gray arrow.

In Example 2, the luminescent layer is formed by layering a plurality of luminescent layers that emits light of the same color. Therefore, in the panel of Example 2 configured of a light emitting elements including a luminescent layer formed by layering a plurality of luminescent layers that emit light of the same color, the light intensity can be substantially doubled as compared with the panel of Example 1 (see "C" in FIG. 17) configured of light emitting elements provided with one luminescent layer as shown in "B" of FIG. 17. That is, the luminance efficiency of the light emitting element of Example 2 is about 24 times(=2×12 times) as compared with the luminance efficiency of the conventional green light organic EL element, and is actually such as shown in "B" and "D" in FIG. 17.

Since the configuration and structure of the light emitting element and the projection type display device of Example 2 can be substantially the same as the configuration and structure of the light emitting element and the projection type display device of Example 1, except for the above points, detailed description will be omitted.

EXAMPLE 3

The panel in the projection type display device of the third embodiment is a combination of the panel in the projection type display device of Example 1 and the panel in the projection type display device of Example 2. That is, in the projection type display device (projector) of the third embodiment, the luminescent layer in the light emitting element constituting the panel is formed by layering a plurality of luminescent layers 33A and 33B that emit light of the same color.

When a resonator structure is formed between the light reflecting layer 50 and the second interface as described in Example 1, in an optical resonator of Fabry Perot, assuming that the light reflectance of the light reflecting layer 50 is $r_F$ and the light transmittance is $t_F$, the light reflectance of the second electrode 32 is $r_B$ and the light transmittance is $t_B$, the electric field intensity of the light emitted in the luminescent layer 33A is $E_i$, and the electric field intensity of the light output from the second electrode 32 is $E_t$, $$|E_t/E_i|^2 = t_F^2/\{1+(a \cdot r_F)^2 + 2a \cdot r_F \cos(\delta)\} \quad (2)$$

However, assuming that a is the absolute value of light intensity, the maximum peak wavelength of the spectrum of light generated in the luminescent layer 33A is $\lambda$, the cavity length is L, and the angle of incidence of light on the second interface when the light resonating in the cavity collides with the second interface is $\theta$, $$\delta = 2\pi(2nL/\lambda)\cos(\theta) \quad (3)$$

Here, n is a positive integer, and L is the value of optical distance ($OL_1 + OL_2$).

Further, the value of the full width at half maximum (FWHM) of the light output from the light emitting element can be represented by.

$$\text{FWHM} = c(1-r_F)/\{2\pi L(r_F)^{1/2}\} \quad (4)$$

where c is the speed of light. In Example 2, each of the values of $m_1$ and $m_2$ is set to "1". That is, the resonator length L is set to a large value. Therefore, the value of FWHM represented by formula (4) can be made smaller than that of the conventional organic EL element.

Furthermore, the light emitting element of Example 3 further includes a light reflecting layer 50, the light emitted in the luminescent layer is resonated between the light reflecting layer 50 and an second interface of the second electrode 32 and the organic layer 33, and a portion of the light is output from the second electrode 32. The light reflecting layer 50 may be arranged below the first electrode 31, as in Example 1, or may be arranged above the first electrode 31 and below the luminescent layer 33A. Alternatively, the formation of the light reflecting layer 50 may be omitted, and the first electrode 31 may also serve as the light reflecting layer 50. Such a resonator structure can be substantially the same as the resonator structure described in Example 1. The increase in luminance is actually as shown in "A" and "D" in FIG. 17.

The light emitting element of Example 3 also satisfies the above-mentioned formulas (1-1) and (1-2). Specifically, $m_1 = m_2 = 1$. However, these values are not limiting, and for example, $m_1 = m_2 = 0$ can be set. Table 2 below shows the values of the optical distance ($OL_1 + OL_2$) obtained from formulas (1-1) and (1-2) when $m_1 = m_2 = 0$. The peak wavelength $\lambda$ is as shown in Table 1.

TABLE 2

|  | $m_1$ | $m_2$ | $OL_1 + OL_2$ |
|---|---|---|---|
| First panel | 0 | 0 | 110 nm |
| Second panel | 0 | 0 | 70 nm to 90 nm |
| Third panel/Fourth panel | 0 | 0 | 60 nm |

Further, the results of obtaining the xy chromaticity coordinates of the first panel, the second panel, and the third panel/fourth panel are shown in Table 3 below, and the red color of the BT. 2020 standard can be expressed.

TABLE 3

|  | Drive voltage | Efficiency (cd/A) | x | y |
|---|---|---|---|---|
| First panel | 5.1 | 23.2 | 0.700 | 0.300 |
| Second panel | 6.3 | 114.4 | 0.318 | 0.634 |
| Third panel/Fourth panel | 6.2 | 4.4 | 0.156 | 0.093 |

Since the configuration and structure of the light emitting element and the projection type display device of Example 3 can be substantially the same as the configuration and structure of the light emitting element and the projection type display device of Example 1 and Example 2, except for the above points, detailed description will be omitted.

Although the present disclosure has been described above based on preferred examples, the present disclosure is not limited to these examples. The configuration and structural configuration of the light emitting element, projection type display device, and panel described in the examples are merely exemplary and can be changed as appropriate, and the manufacturing method of the light emitting element is also merely exemplary and can be changed as appropriate. The panel can be embodied not only to be flat, but can also be embodied to be curved. Further, a projection type display device can be configured of a panel provided with light emitting elements that output light other than visible light, for example, infrared light, or a combination of such a panel and a panel provided with light emitting elements that output visible light.

In the light emitting elements of the examples, the insulating layer 28 is left on the substrate 26 between the first electrode 31 and the first electrode 31, but the insulating layer 28 does not have to be formed, and in this case the organic layer 33 may be formed on the substrate 26 and the first electrode 31. Because of a stepped portion generated on the first electrode 31, a cut portion may be formed between a layer (for example, an intermediate layer) constituting a portion of the organic layer 33 formed on the first electrode 31 and a portion of the organic layer 33 formed on the substrate 26, but this is not a problem.

Figure 15:
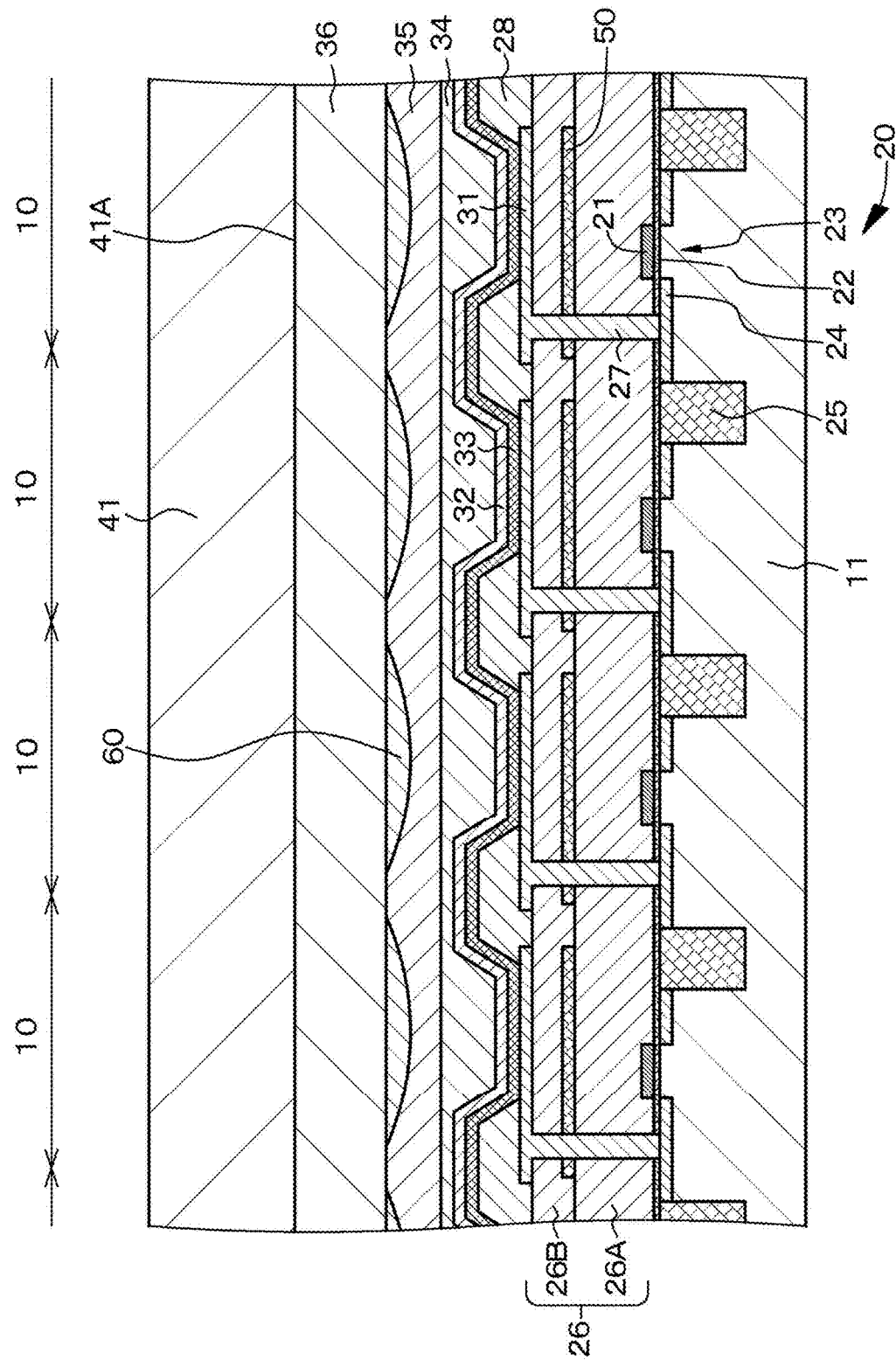
FIG. 15 is a schematic partial cross-sectional view of Modification Example 7 of the light emitting element of Example 1 and the panel constituting the projection type display device of Example 1.

In the examples, the lens member (on-chip lens) 60 was embodiment to have a plano-convex lens shape, and the convex surface was embodied to be located on the second substrate side, but the convex surface can be also embodied to be located on the first substrate side as in Modification Example 7 of Example 1 shown in FIG. 15. The light emitting element having such a configuration can be obtained by forming, for example, a base layer 36 composed of an acrylic resin on the inner surface 41A of the second substrate 41 facing the first substrate 11, forming the lens member (on-chip lens) 60 on the base layer 36 (on the surface of the base layer 36 facing the protective layer 34), and then joining the protective layer 34 to the lens member 60 and the base layer 36 (corresponding to the structure) through the resin layer 35 (sealing resin layer).

Figure 16:
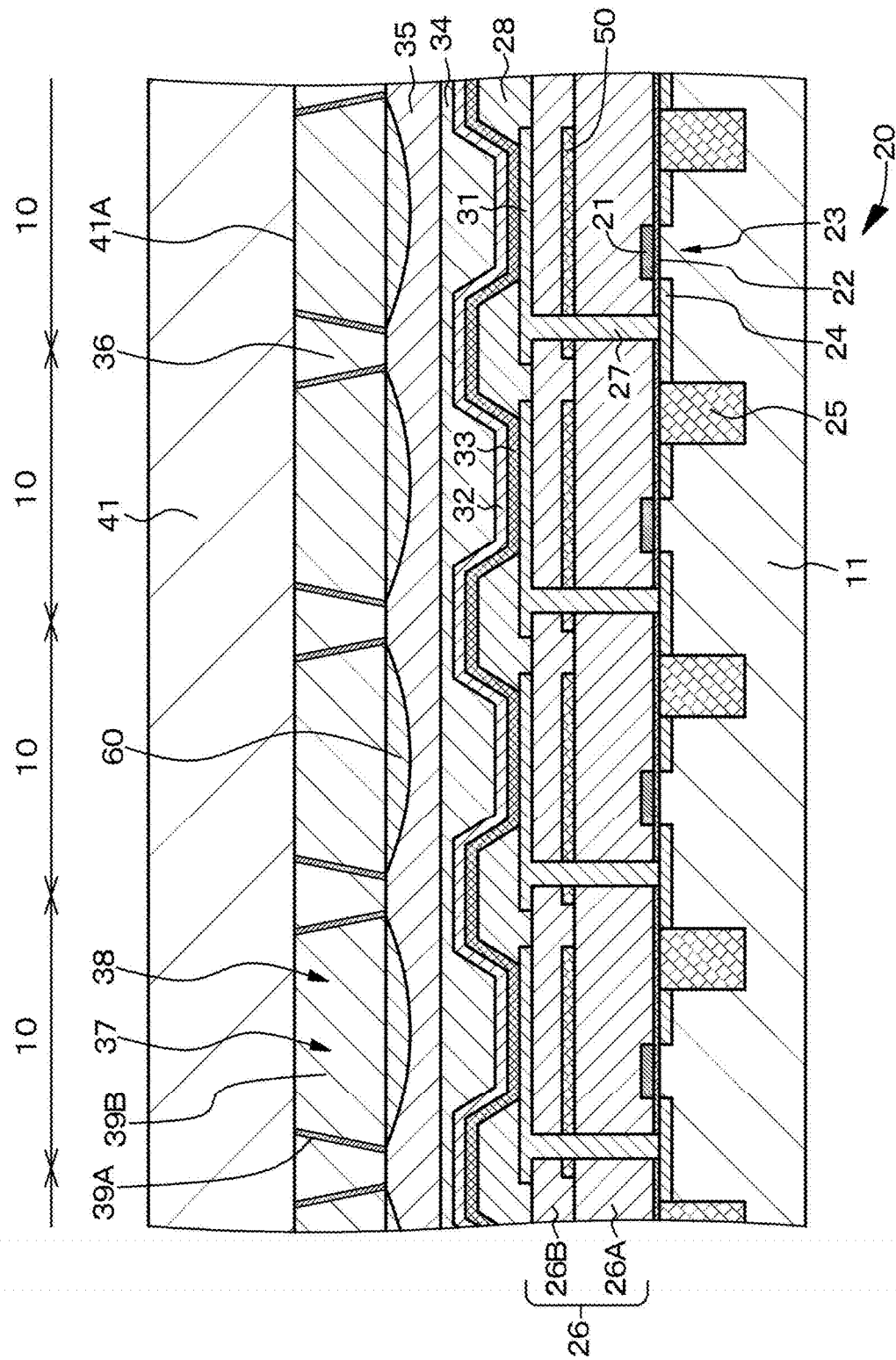
FIG. 16 is a schematic partial cross-sectional view of Modification Example 8 of the light emitting element of Example 1 and the panel constituting the projection type display device of Example 1.

Further, a light guide path 37 may be formed above (light outputting side) the lens member (on-chip lens) 60, as in Modification Example 8 of Example 1 shown in FIG. 16. Specifically, the base layer 36 is formed on the inner surface 41A of the second substrate 41, and an opening (hole) 38 is formed in the region of the base layer 36 on which the lens member (on-chip lens) 60 is to be formed, and a light reflecting film 39A is formed on the side surface of the opening 38. Then, for example, a transparent material 39B made of an acrylic resin is embedded in the opening 38, and then a lens member (on-chip lens) 60 is formed on the transparent material 39B (on the surface of the transparent material 39B facing the protective layer 34). Next, the protective layer 34 is joined to the lens member 60 and the base layer 36 (corresponding to the structure) through the resin layer (sealing resin layer) 35 thereby making it possible to obtain a light emitting element having such a configuration. Here, by selecting materials such that the value of the refractive index of the material constituting the light reflecting film 39A is smaller than the value of the refractive index of the material constituting the transparent material 39B, the probability that the light from the transparent material 39B that collides with the light reflecting film 39A is totally reflected by the light reflecting film 39A is increased, and the light output from the lens member 60 can be more reliably guided to the space located above the lens member 60. Further, it is preferable that the side surface of the opening (hole) 38 has a shape narrowed toward the second substrate 41 (so-called reverse taper shape in the state shown in FIG. 16). Modification Examples 7 and 8 of Example 1 shown in FIGS. 15 and 16 can be adopted in other modification examples of Example 1 and other examples.

Further, the projection type display device according to the first to third aspects of the present disclosure including various preferable embodiments described above may be also incorporated in, for example, a personal computer, a mobile phone, a PDA (personal digital assistant), game equipment, a watch, a bracelet, a ring, and the like.

A planar light emitting device can also be configured from the light emitting elements and panels described in the examples. That is, the planar light emitting device is configured of
a panel comprising:
the first substrate 11;
the second substrate 41; and
a plurality of light emitting elements sandwiched between the first substrate 11 and the second substrate 41, wherein
each light emitting element is configured of the light emitting element 10, 10' of Example 1 to Example 3. With such a planar light emitting device, for example, a bulletin board such as a sign board, a poster, and a blackboard, an electronic advertisement, and an electronic POP can be configured, and various lighting devices including various backlight devices and planar light source devices can be configured.

A light shielding region may be provided between the light emitting element and the light emitting element in order to prevent light output from a certain light emitting element from penetrating into the light emitting element adjacent to the certain light emitting element and causing optical crosstalk. That is, a groove may be formed between the light emitting element and the light emitting element, and a light shielding material may be embedded in the groove to form a light shielding region. By providing the light shielding region in this way, it is possible to reduce the rate at which the light output from a certain light emitting element penetrates into the adjacent light emitting element, and it is possible to reliably suppress the occurrence of partial duplication of unit pixels.

The projection type display devices of Examples 1 to 3 can be applied to various technical fields. For example, when adopted in a display device constituting a head-mounted display (HMD), this display device includes
a frame attached to the observer's head and
an image display device attached to the frame, wherein
the image display device includes
an image forming apparatus provided with the projection type display device of Examples 1 to 3 and
an optical device that receives and outputs light output from the image forming apparatus, and
the optical device is configured of
a light guide plate that outputs light toward the observer after the light incident from the image forming apparatus propagates inside by total reflection;
a first deflecting means for deflecting the light incident on the light guide plate, so that the light incident on the light guide plate is totally reflected inside the light guide plate, and
a second deflecting means that deflects the light propagated inside the light guide plate by total reflection multiple times in order to output the light propagated inside the light guide plate by total reflection from the light guide plate.

Alternatively, the projection type display device of Examples 1 to 3 can also be adopted in an image forming apparatus in a retinal projection type display based on Maxwell vision in which an image is displayed by directly projecting an image (light beam) onto the observer's retina, specifically, in a retinal projection type head-mounted display.

Alternatively, it can also be adopted in a light source (projector) for structured light, and in this case, a 3D sensing device includes an image forming apparatus provided with the projection type display device of Examples 1 to 3 and an image capturing device that captures an image projected onto an object by the projection type display device.

Alternatively, for example, a wearable device such as a wristwatch, a bracelet, or a ring may be configured to include the projection display devices of Examples 1 to 3.

The present disclosure can also take the following configurations.

[A01] «Light Emitting Element: First Aspect»
A light emitting element
a first electrode;
an organic layer formed on the first electrode and including a luminescent layer composed of an organic luminescent material; and
a second electrode formed on the organic layer, wherein
the luminescent layer is configured by layering a plurality of luminescent layers that emit light of the same color.

[A02]
The light emitting element according to [A01], wherein an intermediate layer is provided between the luminescent layer and the luminescent layer.

[A03]
The light emitting element according to [A02], wherein the intermediate layer is configured of at least one kind of material selected from the group consisting of, lithium (Li), calcium (Ca), sodium (Na), cesium (Cs), molybdenum oxide ($MoO_3$), vanadium oxide ($V_2O_5$) and tungsten oxide ($WO_3$).

[A04]
The light emitting element according to any one of [A01] to [A03], wherein the plurality of luminescent layers have the same composition.

[A05]
The light emitting element according to any one of [A01] to [A04], further comprising
a light reflecting layer, wherein
light emitted in the luminescent layer is resonated between the light reflecting layer and an interface of the second electrode and the organic layer, and a portion of the light is output from the second electrode.

[A06]
The light emitting element according to [A05], wherein the light reflecting layer is arranged below the first electrode.

[A07]0
The light emitting element according to [A05], wherein the light reflecting layer is arranged above the first electrode.

[A08]
The light emitting element according to any one of [A05] to [A07], wherein where an optical distance from a maximum light emission position of the luminescent layer to the luminescent layer is denoted by $OL_1$, an optical distance from the maximum light emission position of the luminescent layer to the interface is denoted by $OL_2$, and $m_1$ and $m_2$ are integers, the following formulas (1-1) and (1-2) are satisfied.

$$0.7\{-\Phi_1/(2\pi)+m_1\} \leq 2 \times OL_1/\lambda \leq 1.2\{-\Phi_1/(2\pi)+m_1\} \quad (1\text{-}1)$$

$$0.7\{-\Phi_2/(2\pi)+m_2\} \leq 2 \times OL_2/\lambda \leq 1.2\{-\Phi_2/(2\pi)+m_2\} \quad (1\text{-}2)$$

Here, $\lambda$: maximum peak wavelength of the spectrum of light generated in the luminescent layer (or the desired wavelength in the light generated in the luminescent layer);

$\Phi_1$: phase shift amount (unit: radian) of reflected light generated at the light reflecting layer (light reflected at the light reflecting layer). However, $-2\pi<\Phi_1\leq0$; and $\Phi_2$: phase shift amount (unit: radian) of reflected light (light reflected at the interface) generated at the interface. However, $-2\pi<\Phi_2\leq0$.

[A09]
The light emitting element according to [A07], wherein $m_1\geq1$ and $m_2\geq1$ are satisfied.

[A10]
The light emitting element according to [A08] or [A09], wherein the value of a full width at half maximum of the light output from the light emitting element is 30 nm or less.

[A11]
The light emitting element according to any one of [A08] to [A10], wherein where a light intensity at a center line passing through the center of a light emitting unit of the light emitting element is taken as 100%, a directional half-value angle, which is the angle formed by the center line and the direction with respect to the center line that has a 50% light intensity, is 25 degrees or less.

[A12]
The light emitting element according to any one of [A01] to [A11], wherein a lens member is arranged on the light outputting side of the organic layer.

[A13]
The light emitting element according to any one of [A01] to [A12], wherein a metal thin-film filter layer is further formed between the first electrode and the light reflecting layer.

[A14]
The light emitting element according to any one of [A01] to [A13], wherein when the light intensity at the center line passing through the center of the light emitting unit of the light emitting element is denoted by $I_0$ and the light intensity at the center line passing through the center of the light emitting unit of the light emitting element without a light reflecting layer is denoted by $I_{conv}$, $$I_0/I_{conv} \geq 5$$

is satisfied.

[A15]
The light emitting element according to any one of [A01] to [A14], wherein
the first electrode and the light reflecting layer are surrounded by a light shielding portion or a light reflecting portion.

[A16]
The light emitting element according to any one of [A01] to [A15], wherein
the first electrode is composed of a light transmitting material, and the second electrode is composed of a semi-light transmitting material.

[A17]
The light emitting element according to [A16], wherein
the first electrode is composed of ITO or IZO, and
the second electrode is composed of at least one kind of material selected from the group consisting of Ag, Ag—Mg, Ag—Nd—Cu, Au, Ag—Cu, Al, and Al—Cu.

[B01] «Light Emitting Element: Second Aspect»
A light emitting element comprising
a first electrode;
an organic layer formed on the first electrode and including a luminescent layer composed of an organic luminescent material; and
a second electrode formed on the organic layer, and
further comprising
a light reflecting layer below the first electrode, wherein
light emitted in the luminescent layer is resonated between the light reflecting layer and an interface of the second electrode and the organic layer, and a portion of the light is output from the second electrode.

[B02]
The light emitting element according to [B01], wherein
where an optical distance from a maximum light emission position of the luminescent layer to the luminescent layer is denoted by $OL_1$, an optical distance from the maximum light emission position of the luminescent layer to the interface is denoted by $OL_2$, and $m_1$ and $m_2$ are integers, the following formulas (1-1) and (1-2) are satisfied.

$$0.7\{-\Phi_1/(2\pi)+m_1\} \leq 2 \times OL_1/\lambda \leq 1.2\{-\Phi_1/(2\pi)+m_1\} \quad (1\text{-}1)$$

$$0.7\{-\Phi_2/(2\pi)+m_2\} \leq 2 \times OL_2/\lambda \leq 1.2\{-\Phi_2/(2\pi)+m_2\} \quad (1\text{-}2)$$

Here,
λ: maximum peak wavelength of the spectrum of light generated in the luminescent layer (or the desired wavelength in the light generated in the luminescent layer);
$\Phi_1$: phase shift amount (unit: radian) of reflected light generated at the light reflecting layer (light reflected at the light reflecting layer). However, $-2\pi < \Phi_1 \leq 0$; and
$\Phi_2$: phase shift amount (unit: radian) of reflected light (light reflected at the interface) generated at the interface. However, $-2\pi < \Phi_2 \leq 0$.

[B03]
The light emitting element according to [B02], wherein $m_1 \geq 1$ and $m_2 \geq 1$ are satisfied.

[B04]
The light emitting element according to [B02] or [B03], wherein the value of a full width at half maximum of the light output from the light emitting element is 30 nm or less.

[B05]
The light emitting element according to any one of [B02] to [B04], wherein where a light intensity at a center line passing through the center of a light emitting unit of the light emitting element is taken as 100%, a directional half-value angle, which is the angle formed by the center line and the direction with respect to the center line that has a 50% light intensity, is 25 degrees or less.

[B06]
The light emitting element according to any one of [B01] to [B05], wherein a lens member is arranged on the light outputting side of the organic layer.

[B07]
The light emitting element according to any one of [B01] to [B06], wherein a metal thin-film filter layer is further formed between the first electrode and the light reflecting layer.

[B08]
The light emitting element according to any one of [B01] to [B07], wherein when the light intensity at the center line passing through the center of the light emitting unit of the light emitting element is denoted by $I_0$ and the light intensity at the center line passing through the center of the light emitting unit of the light emitting element without a light reflecting layer is denoted by $I_{conv}$, $$I_0/I_{conv} \geq 5$$

is satisfied.

[B09]
The light emitting element according to any one of [B01] to [B08], wherein
the first electrode and the light reflecting layer are surrounded by a light shielding portion or a light reflecting portion.

[B10]
The light emitting element according to any one of [B01] to [B09], wherein
the first electrode is composed of a light transmitting material, and the second electrode is composed of a light semi-transmitting material.

[B11]
The light emitting element according to [B10], wherein
the first electrode is composed of ITO or IZO, and
the second electrode is composed of at least one kind of material selected from the group consisting of Ag, Ag—Mg, Ag—Nd—Cu, Au, Ag—Cu, Al, and Al—Cu.

[C01] «Projection Type Display Device: First Aspect»
A projection type display device configured of
a panel comprising:
a first substrate;
a second substrate; and
a plurality of light emitting elements sandwiched between the first substrate and the second substrate, wherein
each light emitting element includes
a first electrode;
an organic layer formed on the first electrode and including a luminescent layer composed of an organic luminescent material; and
a second electrode formed on the organic layer,
the luminescent layer being configured by layering a plurality of luminescent layers that emit light of the same color.

[C02] «Projection Type Display Device: Second Aspect»
A projection type display device configured of
a panel comprising:
a first substrate;
a second substrate; and
a plurality of light emitting elements sandwiched between the first substrate and the second substrate, wherein
each light emitting element includes
a first electrode;
an organic layer formed on the first electrode and including a luminescent layer composed of an organic luminescent material; and
a second electrode formed on the organic layer, and
each light emitting element further includes a light reflecting layer provided below the first electrode, and
light emitted in the luminescent layer is resonated between the light reflecting layer and an interface of the second electrode and the organic layer, and a portion of the light is output from the second electrode.

[C03] «Projection Type Display Device: Third Aspect»
A projection type display device configured of
a panel comprising:
a first substrate;
a second substrate; and
a plurality of light emitting elements sandwiched between the first substrate and the second substrate, wherein
each light emitting element is configured of the light emitting element according to any one of [A01] to [B11].

[C04]

The projection type display device according to any one of [C01] to [C03], that is configured of three panels of
one red light outputting panel that outputs red light,
one green light outputting panel that outputs green light, and
one blue light outputting panel that outputs blue light.

[C05]

The projection type display device according to [C04], that is configured of four panels and further includes
one blue light outputting panel that outputs blue light.

[C06]

The projection type display device according to [C05], wherein the four panels are arranged in an array.

[C07]

The projection type display device according to [C05], wherein the four panels are arranged in a 2×2 state.

[C08]

The projection type display device according to any one of [C01] to [C07], further comprising a projection lens system on the light outputting side.

[C09]

The projection type display device according to any one of [C01] to [C07], comprising:
image synthesizing means for synthesizing images output from a plurality of panels into one image, and
a projection lens system on the light outputting side of the image synthesizing means.

[C10]

The projection type display device according to [C09], wherein
the image synthesizing means is configured of an unpolarized dichroic prism.

[C11]

The projection type display device according to [C09], wherein
the image synthesizing means is configured of a Philips prism.

[C12]

The projection type display device according to any one of [C08] to [C11], wherein light incident on the projection lens system is parallel light.

[C13]

The projection type display device according to any one of [C01] to [C12], wherein the panel is curved.

[D01] «Planar Light Emitting Device»

A planar light emitting device configured of
a panel comprising:
a first substrate;
a second substrate; and
a plurality of light emitting elements sandwiched between the first substrate and the second substrate, wherein
each light emitting element is configured of the light emitting element according to any one of [A01] to [B11].

[E01] «Display Device (HMD)»

A display device including
a frame attached to the observer's head and
an image display device attached to the frame, wherein
the image display device includes
an image forming apparatus provided with the projection type display device according to any one of [C01] to [C13] and
an optical device that receives and outputs light output from the image forming apparatus, and
the optical device is configured of
a light guide plate that outputs light toward the observer after the light incident from the image forming apparatus propagates inside by total reflection;
a first deflecting means for deflecting the light incident on the light guide plate, so that the light incident on the light guide plate is totally reflected inside the light guide plate, and
a second deflecting means that deflects the light propagated inside the light guide plate by total reflection multiple times in order to output the light propagated inside the light guide plate by total reflection from the light guide plate.

[E02] «Three-Dimensional Sensing Device»

A three-dimensional sensing device including
an image forming apparatus provided with the projection type display device according to any one of [C01] to [C13] and
an image capturing device that captures an image projected by the projection type display device on an object.

[E03] «Wearable Device»

A wearable device including an image forming apparatus provided with the projection type display device according to any one of [C01] to [C13].

REFERENCE SIGNS LIST

1R Red light outputting panel (first panel)
1G Green light outputting panel (second panel)
1B$_1$, 1B$_2$ Blue light outputting panel (third panel, fourth panel)
10, 10' Light emitting element
11 First substrate
20 Transistor
21 Gate electrode
22 Gate insulating layer
23 Channel forming region
24 Source/drain region
25 Element separation region
26 Substrate (interlayer insulating layer)
26A Lower interlayer insulating layer
26B Upper interlayer insulating layer
27 Contact plug
28 Insulating layer
31 First electrode
32 Second electrode
33 Organic layer
33A, 33B Luminescent layer
33C Hole injection layer and hole transport layer
33D Intermediate layer (charge generation layer)
33E Electron transport layer and electron injection layer
34 Protective layer (planarizing layer)
35 Sealing resin layer
36 Base layer
37 Light guide path
38 Opening
39A Light reflecting film
39B Transparent material
41 Second substrate
50 Light reflecting layer
51 Light shielding part or light reflecting portion
52 Metal thin-film filter layer
53 Pores provided in the metal thin-film filter layer
54 Light absorption layer (black matrix layer)
60 Lens member (on-chip microlens)
70 Projection lens system
71 Image synthesis means
72 Unpolarized dichroic prism
73 Philips prism

The invention claimed is:

1. A light emitting element, comprising:
   a first electrode;
   an organic layer on the first electrode, wherein the organic layer includes a plurality of luminescent layers composed of an organic luminescent material;
   a second electrode on the organic layer, wherein
      the organic layer is configured by layering the plurality of luminescent layers that emit light of same color;
   a light reflecting layer in an insulating layer which is in direct contact with the first electrode; and
   a metal thin-film filter layer between the first electrode and the light reflecting layer which is in the insulating layer which is in direct contact with the first electrode.

2. The light emitting element according to claim 1, further comprising an intermediate layer between a first luminescent layer of the plurality of luminescent layers and a second luminescent layer of the plurality of luminescent layers.

3. The light emitting element according to claim 2, wherein the intermediate layer is configured of a material which comprises one of: lithium (Li), calcium (Ca), sodium (Na), cesium (Cs), molybdenum oxide ($MoO_3$), vanadium oxide ($V_2O_5$) or tungsten oxide ($WO_3$).

4. The light emitting element according to claim 1, wherein the plurality of luminescent layers have same composition.

5. The light emitting element according to claim 1, wherein
   the light emitted in at least one luminescent layer of the plurality of luminescent layers is resonated between the light reflecting layer and an interface of the second electrode and the organic layer, and
   a portion of the light is output from the second electrode.

6. A light emitting element, comprising:
   a first electrode;
   an organic layer on the first electrode, wherein the organic layer includes a plurality of luminescent layers laye-r-composed of an organic luminescent material; and
   a second electrode on the organic layer, and further comprising
   a light reflecting layer in an insulating layer which is in direct contact with the first electrode, wherein
      light emitted in the luminescent layer is resonated between the light reflecting layer and an interface of the second electrode and the organic layer, and
      a portion of the light is output from the second electrode; and
   a metal thin-film filter layer between the first electrode and the light reflecting layer which is in the insulating layer which is in direct contact with the first electrode.

7. The light emitting element according to claim 6, wherein
   where an optical distance from a maximum light emission position of a first luminescent layer of the plurality of luminescent layers to a second luminescent layer of the plurality of luminescent layers is denoted by $OL_1$, an optical distance from the maximum light emission position of the first luminescent layer to the interface is denoted by $OL_2$, and $m_1$ and $m_2$ are integers, the following formulas (1-1) and (1-2) are satisfied.

$$0.7\{-\phi_1/(2\pi)+m_1\} \le 2\times OL_1/\lambda \le 1.2\{-\phi_1/(2\pi)+m_1\} \quad (1\text{-}1)$$

$$0.7\{-\phi_2/(2\pi)+m_2\} \le 2\times OL_2/\lambda \le 1.2\{-\phi_2/(2\pi)+m_2\} \quad (1\text{-}2)$$

Here,
   $\lambda$: maximum peak wavelength of a spectrum of light generated in the first luminescent layer (or desired wavelength in the light generated in the first luminescent layer);
   $\phi_1$: phase shift amount (unit: radian) of reflected light generated at the light reflecting layer. However, $-2\pi < \phi_1 \le 0$; and
   $\phi_2$: phase shift amount (unit: radian) of reflected light generated at the interface. However, $-2\pi < \phi_2 \le 0$.

8. The light emitting element according to claim 7, wherein a value of a full width at half maximum of the light output from the light emitting element is 30 nm or less.

9. The light emitting element according to claim 7, wherein where a light intensity at a center line passing through a center of a light emitting unit of the light emitting element is taken as 100%, a directional half-value angle is 25 degrees or less, and
   the directional half-value angle is formed by the center line and a direction with respect to the center line that has a 50% light intensity.

10. The light emitting element according to claim 9, wherein
    when the light intensity at the center line passing through the center of the light emitting unit of the light emitting element is denoted by $I_o$ and the light intensity at the center line passing through the center of the light emitting unit of the light emitting element without the light reflecting layer is denoted by $I_{conv}$, an $$I_o/I_{conv} \le 5$$

is satisfied.

11. The light emitting element according to claim 6, wherein a lens member is arranged on a light outputting side of the organic layer.

12. A projection type display device, comprising:
    at least one panel comprising:
       a first substrate;
       a second substrate; and
       a plurality of light emitting elements sandwiched between the first substrate and the second substrate, wherein
       each light emitting element includes
          a first electrode;
          an organic layer on the first electrode, wherein the organic layer includes a plurality of luminescent layers composed of an organic luminescent material;
          a second electrode on the organic layer,
          the organic layer is configured by layering the plurality of luminescent layers that emit light of same color;
          a light reflecting layer in an insulating layer which is in direct contact with the first electrode; and
          a metal thin-film filter layer between the first electrode and the light reflecting layer which is in the insulating layer which is in direct contact with the first electrode.

13. The projection type display device according to claim 12, further comprises three panels of
    one red light outputting panel that outputs red light,
    one green light outputting panel that outputs green light, and
    one first blue light outputting panel that outputs blue light,
    wherein the three panels include the at least one panel.

14. The projection type display device according to claim 13, further comprises one second blue light outputting panel that outputs blue light.

15. The projection type display device according to claim 12, further comprising a projection lens system on a light outputting side of a prism.

16. The projection type display device according to claim 12, comprising:
- a prism to synthesize images output from a plurality of panels into one image, wherein the plurality of panels include the at least one panel; and
- a projection lens system on a light outputting side of the prism.

17. A projection type display device, comprising:
a panel comprising:
- a first substrate;
- a second substrate; and
- a plurality of light emitting elements sandwiched between the first substrate and the second substrate, wherein
- each light emitting element of the plurality of light emitting elements includes:
  - a first electrode;
  - an organic layer on the first electrode, wherein the organic layer includes a plurality of luminescent layers composed of an organic luminescent material;
  - a second electrode on the organic layer;
  - a light reflecting layer in an insulating layer which is in direct contact with the first electrode; and
  - a metal thin-film filter layer between the first electrode and the light reflecting layer which is in the insulating layer which is in direct contact with the first electrode, wherein
    - light emitted in at least one luminescent layer of the plurality of luminescent layers is resonated between the light reflecting layer and an interface of the second electrode, and
    - the organic layer, and a portion of the light is output from the second electrode.

18. A projection type display device, comprising:
a panel comprising:
- a first substrate;
- a second substrate; and
- a plurality of light emitting elements sandwiched between the first substrate and the second substrate, wherein
- each light emitting element of the plurality of light emitting elements includes:
  - a first electrode;
  - an organic layer on the first electrode, wherein the organic layer includes a plurality of luminescent layers composed of an organic luminescent material;
  - a second electrode on the organic layer;
  - a light reflecting layer in an insulating layer which is in direct contact with the first electrode; and
  - a metal thin-film filter layer between the first electrode and the light reflecting layer which is in the insulating layer which is in direct contact with the first electrode.

19. A planar light emitting device, comprising:
a panel comprising:
- a first substrate;
- a second substrate; and
- a plurality of light emitting elements sandwiched between the first substrate and the second substrate, wherein
- each light emitting element of the plurality of light emitting elements includes:
  - a first electrode;
  - an organic layer on the first electrode, wherein the organic layer includes a plurality of luminescent layers composed of an organic luminescent material;
  - a second electrode on the organic layer;
  - a light reflecting layer in an insulating layer which is in direct contact with the first electrode; and
  - a metal thin-film filter layer between the first electrode and the light reflecting layer which is in the insulating layer which is in direct contact with the first electrode.

* * * * *